(12) United States Patent
Borneman et al.

(10) Patent No.: US 11,959,984 B2
(45) Date of Patent: Apr. 16, 2024

(54) MODEL-INSENSITIVE CONTROL OF NONLINEAR RESONATORS

(71) Applicant: Quantum Valley Investment Fund LP, Waterloo (CA)

(72) Inventors: Troy W. Borneman, Waterloo (CA); David G. Cory, Branchton (CA)

(73) Assignee: Quantum Valley Investment Fund LP, Waterloo (CA)

( * ) Notice: Subject to any disclaimer, the term of this patent is extended or adjusted under 35 U.S.C. 154(b) by 137 days.

(21) Appl. No.: 17/122,120

(22) Filed: Dec. 15, 2020

(65) Prior Publication Data

US 2021/0141037 A1    May 13, 2021

Related U.S. Application Data

(63) Continuation of application No. PCT/CA2018/050903, filed on Jul. 25, 2018.

(51) Int. Cl.
*G01R 33/36* (2006.01)

(52) U.S. Cl.
CPC .................. *G01R 33/3607* (2013.01)

(58) Field of Classification Search
None
See application file for complete search history.

(56) References Cited

U.S. PATENT DOCUMENTS 10,587,277 B2    3/2020   Hincks et al.
11,170,317 B2 *  11/2021  Chow ................ H03K 19/1958
2006/0248945 A1  11/2006  Bleich
2007/0052416 A1   3/2007  Bottcher et al.
2013/0090884 A1   4/2013  Glaser et al.
2013/0096698 A1   4/2013  Ulyanov
(Continued)

FOREIGN PATENT DOCUMENTS

CA    2910540    11/2014
EP    0895092    2/1999
(Continued)

OTHER PUBLICATIONS

"A portable single-sided magnet system for remote NMR measurements of pulmonary function" to Dabaghyan et al. (Year: 2013).*
(Continued)

*Primary Examiner* — Douglas X Rodriguez
(74) *Attorney, Agent, or Firm* — Henry Patent Law Firm PLLC

(57) ABSTRACT

A method is presented for controlling a spin system in an external magnetic field. The method includes sending a first pulse to a resonator over a first period. The resonator generates a magnetic field in response to receiving the first pulse. Moreover, the resonator applies the magnetic field to the spin system and the first pulse maintains the magnetic field in a transient state during the first period. The method also includes sending a second pulse to the resonator over a second period immediately following the first period. The resonator alters a magnitude of the magnetic field to zero in response to receiving the second pulse. Other methods are presented for controlling a spin system in an external magnetic field, including systems for controlling a spin system in an external field.

15 Claims, 16 Drawing Sheets

(56) References Cited

U.S. PATENT DOCUMENTS

| | | |
|---|---|---|
| 2014/0264285 A1 | 9/2014 | Chow |
| 2015/0262073 A1 | 9/2015 | Lanting |
| 2015/0358022 A1* | 12/2015 | McDermott, III ........................ H03K 19/1958 326/5 |
| 2016/0041536 A1 | 2/2016 | Benosman et al. |
| 2017/0214410 A1 | 7/2017 | Hincks et al. |

FOREIGN PATENT DOCUMENTS

| | | |
|---|---|---|
| JP | 4040745 | 11/2007 |
| WO | 2014176662 | 11/2014 |

OTHER PUBLICATIONS

"A portable single-sided magnet system for remote NMR measurements of pulmonary function", Dabaghyan et al. (Year: 2014).*

"Pulse Sequence for Elimination of RF Receiver Coil Ring Down", Hrovat et al. (Year: 2001).*

EPO, Extended European Search Report dated Jun. 4, 2021, in EP 18927656.1, 12 pgs.

Dabaghyan, et al., "A portable single-sided magnet system for remote NMR measurements of pulmonary function", NMR in Biomedicine, Jun. 23, 2014, 11 pgs.

Hrovat, et al., "Pulse Sequence for Elimination of RF Receiver Coil Ring Down", Proc. Intl. Soc. Mag. Reson. Med 9, Apr. 21, 2001, 1 pg.

Grezes, C., et al., "Multimode Storage and Retrieval of Microwave Fields in a Spin Ensemble", Physical Review X 4, 021049, 2014, 9 pgs.

Gustavsson, Simon, et al., "Improving Quantum Gate Fidelities by Using a Qubit to Measure Microwave Pulse Distortions", Physical Review Letters 110, 040502, 2013, 5 pgs.

Gutirrez, Mauricio, et al., "Approximation of realistic errors by Clifford channels and Pauli measurements", Physical Review A 87, 030302(R), 2013, 5 pgs.

Hocker, David, et al., "Characterization of control noise effects in optimal quantum unitary dynamics", http://arxiv.org/abs/1405.5950v2 [quant-ph], Nov. 2014, 11 pgs.

Hodges, J. S., et al., "Universal control of nuclear spins via anisotropic hyperfine interactions", Physical Review A 78, 010303(R), 2008, 4 pgs.

Hoult, D. I., "Fast recovery, high sensitivity NMR probe and preamplifier for low frequencies", Review of Scientific Instruments 50, pp. 193-200, ISSN 0034-6748, 1089-7623, 1979, 9 pgs.

Jäger, Georg, et al., "Optimal quantum control of Bose-Einstein condensates in magnetic microtraps: Consideration of filter effects", Physical Review A 88, 035601, 2013, 4 pgs.

Jiang, et al., "Repetitive Readout of a Single Electronic Spin via Quantum Logic with Nuclear Spin Ancillae", Science, vol. 326, Oct. 9, 2009, 7 pgs.

Khaneja, Navin, et al., "Optimal control of coupled spin dynamics: design of NMR pulse sequences by gradient ascent algorithms", Journal of Magnetic Resonance 172, pp. 296-305, ISSN 1090-7807, 2005, 10 pgs.

Kobzar, Kyryl, et al., "Exploring the limits of broadband 90° and 180° universal rotation pulses", Journal of Magnetic Resonance 225, pp. 142-160, ISSN 1090-7807, 2012, 19 pgs.

Kobzar, Kyryl, et al., "Exploring the limits of broadband excitation and inversion: II. Rf-power optimized pulses", Journal of Magnetic Resonance 194, pp. 58-66, ISSN 1090-7807, 2008, 9 pgs.

Koroleva, Van D. M., et al., "Broadband CPMG sequence with short composite refocusing pulses", Journal of Magnetic Resonance 230, pp. 64-75, ISSN 1090-7807, 2013, 12 pgs.

Kurizki, Gershon, et al., "Quantum technologies with hybrid systems", Proceedings of the National Academy of Sciences 112, 13, pp. 3866-3873, ISSN 0027-8424, 1091-6490, 2015, 8 pgs.

Ladd, T. D., et al., "Quantum computers", Nature 464, pp. 45-53, ISSN 0028-0836, 2010, 9 pgs.

Levitt, M. H., "Spin Dynamics: Basics of Nuclear Magnetic Resonance", pp. 202-215, Wiley, ISBN 9780471489221, 2001, 7 pgs.

Maas, Stephen A., "Nonlinear Microwave and RF Circuits", Artech House Publishers, Boston, MA, 2nd ed., ISBN 9781580534840, 2.2.8 Nonlinear Inductance, 2003, 15 pgs.

Malissa, H., et al., "Superconducting coplanar waveguide resonators for low temperature pulsed electron spin resonance spectroscopy", Review of Scientic Instruments 84, 025116, ISSN 0034-6748, 1089-7623, 2013, 6 pgs.

Mamin, H. J., et al., "Nanoscale Nuclear Magnetic Resonance with a Nitrogen-Vacancy Spin Sensor", Science 339, pp. 557-560, ISSN 0036-8075, 1095-9203, 2013, 5 pgs.

Mandal, Soumyajit, et al., "Axis-matching excitation pulses for CPMG-like sequences in inhomogeneous fields", Journal of Magnetic Resonance 237, pp. 1-10, ISSN 1090-7807, 2013, 10 pgs.

Mandal, Soumyajit, et al., "Direct optimization of signal-to-noise ratio of CPMG-like sequences in inhomogeneous fields", Journal of Magnetic Resonance 247, pp. 54-66, ISSN 1090-7807, 2014, 13 pgs.

Mehring, Michael, "Principles of High resolution NMR in solids", Second Revised and Enlarged Edition, pp. 111-117, Springer, 1976, 10 pgs.

Mohebbi, H. R., et al., "Composite arrays of superconducting microstrip line resonators", Journal of Applied Physics 115, 094502, ISSN 0021-8979, 1089-7550, 2014, 9 pgs.

Moore, Katharine, et al., "On the relationship between quantum control landscape structure and optimization complexity", The Journal of Chemical Physics 128, 154117, ISSN 0021-9606, 1089-7690, 2008, 13 pgs.

Motzoi, F., et al., "Optimal control methods for rapidly time-varying Hamiltonians", Physical Review A 84, 022307, 2011, 9 pgs.

Müller, M.M., et al., "Optimizing entangling quantum gates for physical systems", Physical Review A 84, 042315, 2011, 8 pgs.

Nelder, J. A., et al., "A simplex method for function minimization", The Computer Journal 7, pp. 308-313, ISSN 0010-4620, 1460-2067, 1965, 6 pgs.

Nurdin, Hendra I., et al., "Coherent Quantum LQG Control", http://arxiv.org/abs/0711.2551v2 [quant-ph], May 24, 2009, 2009, 25 pgs.

Palao, José P., et al., "Protecting coherence in optimal control theory: State-dependent constraint approach", Physical Review A 77, 063412, 2008, 11 pgs.

Pontryagin, L. S., et al., "The Mathematical Theory of Optimal Processes", pp. 12-21, CRC Press, 1987, 13 pgs.

Pravia, Marco A., et al., "Robust control of quantum information", The Journal of Chemical Physics 119, pp. 9993-10001, ISSN 0021-9606, 1089-7690, 2003, 10 pgs.

Putz, S., et al., "Protecting a spin ensemble against decoherence in the strong-coupling regime of cavity QED", Nature Physics 10, pp. 720-724, ISSN 1745-2473, 2014, 5 pgs.

Rabitz, H. A., et al., "Quantum Optimally Controlled Transition Landscapes", Science 303, pp. 1998-2001, ISSN 0036-8075, 1095-9203, 2004, 5 pgs.

Rife, Douglas D., et al., "Transfer-Function Measurement with Maximum-Length Sequences", Journal of the Audio Engineering Society 37, 6, pp. 419-444, 1989, 26 pgs.

Rowland, Benjamin, et al., "Implementing quantum logic gates with gradient ascent pulse engineering: principles and practicalities", Philosophical Transactions of the Royal Society of London A: Mathematical, Physical and Engineering Sciences 370, pp. 4636-4650, ISSN 1364-503X, 1471-2962, 2012, 15 pgs.

Schoelkopf, R. J., et al., "Wiring up quantum systems", Nature 451, pp. 664-669, ISSN 0028-0836, 2008, 6 pgs.

Schulte-Herbrüggen, T., et al., "Optimal control for generating quantum gates in open dissipative systems", Journal of Physics B: Atomic, Molecular and Optical Physics 44, 154013, ISSN 0953-4075, 2011, 10 pgs.

Sigillito, A. J., et al., "Fast, low-power manipulation of spin ensembles in superconducting microresonators", Applied Physics Letters 104, 222407, ISSN 0003-6951, 1077-3118, 2014, 5 pgs.

(56) References Cited

OTHER PUBLICATIONS

Skinner, Thomas E., et al., "Reducing the duration of broadband excitation pulses using optimal control with limited RF amplitude", Journal of Magnetic Resonance 167, pp. 68-74, ISSN 1090-7807, 2004, 7 pgs.
Spindler, Philipp E., et al., "Shaped optimal control pulses for increased excitation bandwidth in EPR", Journal of Magnetic Resonance 218, pp. 49-58, ISSN 1090-7807, 2012, 10 pgs.
Taylor, J. M., et al., "High-sensitivity diamond magnetometer with nanoscale resolution", Nature Physics 4, pp. 810-817, ISSN 1745-2473, 2008, 8 pgs.
Tinkham, M., "Introduction to Superconductivity", Second Edition, pp. 237-239, Dover Publications, Mineola, N.Y., ISBN 9780486435039., 2004, 3 pgs.
Tycko, R., "Broadband Population Inversion", Physical Review Letters 51, 9, pp. 775-777, 1983, 3 pgs.
Wimperis, Stephen, "Broadband, Narrowband, and Passband Composite Pulses for Use in Advanced NMR Experiments", Journal of Magnetic Resonance, Series A 109, pp. 221-231, ISSN 1064-1858, 1994, 11 pgs.
Xiang, Ze-Liang, et al., "Hybrid quantum circuits: Superconducting circuits interacting with other quantum systems", Reviews of Modern Physics 85, pp. 623-653, 2013, 31 pgs.
WIPO, International Search Report and Written Opinion dated Apr. 25, 2019, in PCT/CA2018/050903, 10 pgs.
USPTO, Notice of Allowance dated Jan. 15, 2020, in U.S. Appl. No. 15/328,951, 13 pgs.
USPTO, Notice of Allowance dated Oct. 5, 2020, in U.S. Appl. No. 16/809,944, 13 pgs.
USPTO, Non-Final Office Action dated Jul. 9, 2019, in U.S. Appl. No. 15/328,951, 18 pgs.
EPO, Communication pursuant to Art. 94(3) EPC, dated Oct. 24, 2018, 19 pgs.
USPTO, Non-Final Office Action dated Feb. 19, 2019, in U.S. Appl. No. 15/328,951, 19 pgs.
JPO, Decision to Grant dated Jan. 27, 2020, in JP 2017-511885, 2 pgs.
USPTO, Notice of Allowance dated Jun. 26, 2020, in U.S. Appl. No. 16/809,944, 25 pgs.
USPTO, Non-Final Office Action dated Jul. 24, 2018, in U.S. Appl. No. 15/328,951, 27 pgs.
CIPO, Office action dated Nov. 17, 2020, in CA 2,958,250, 4 pgs.
EPO, Extended European Search Report dated Apr. 18, 2018, in 15844306.9, 4 pgs.
EPO, Communication under Rule 71(3) EPC dated Sep. 5, 2019, in EP 15844306.9, 49 pgs.
EPO, Communication pursuant to Rule 114(2) EPC (3rd party observations filed), mailed Aug. 21, 2018, in EP 15844306.9, 50 pgs.
USPTO, Third Party Submission filed Jan. 29, 2018, in U.S. Appl. No. 15/328,951, 54 pgs.
USPTO, Third Party Submission filed Mar. 9, 2018, in U.S. Appl. No. 15/328,951, 59 pgs.
JPO, Office Action dated Jul. 29, 2019, in JP 2017-511885 (with translation), 6 pgs.
Canadian Intellectual Property Office, International Search Report and Written Opinion issued in International Application No. PCT/CA2015/000500 dated Nov. 16, 2015, 7 pgs.
CIPO, Office action dated Jun. 1, 2020, in CA 2,958,250, 7 pgs.
EPO, Extended European Search Report dated Mar. 4, 2020, in EP 20152714.0, 8 pgs.
"International Society of Magnetic Resonance (ISMAR), Program for the 20th ISMAR Meeting", (available online at http://www.ismar2017.org/docs/ISMAR2017Booklet.pdf) Quebec City, Canada, pp. 1, 2, 3, 41., Jul. 23-28, 2017, 4 pgs.
"IPython", Wikipedia, Aug. 14, 2015, 4 pgs.
"Optimal control", Wikipedia, Jul. 19, 2014, 8 pgs.
Bachar, Gil, et al., "Nonlinear induction detection of electron spin resonance", Applied Physics Letters 101, 022602, ISSN 0003-6951, 1077-3118, 2012, 5 pgs.

Barbara, Thomas M., et al., "Phase Transients in NMR Probe Circuits", Journal of Magnetic Resonance 93, pp. 497-508, ISSN 0022-2364, 1991, 12 pgs.
Barends, R., et al., "Superconducting quantum circuits at the surface code threshold for fault tolerance", Nature 508, pp. 500-503, ISSN 0028-0836, 2014, 4 pgs.
Barends, et al., "Superconducting quantum circuits at the surface code threshold for fault tolerance", Nature 508, 2014, pp. 500-503.
Benningshof, O.W.B., et al., "Superconducting microstrip resonator for pulsed ESR of thin films", Journal of Magnetic Resonance 230, pp. 84-87, ISSN 10907807, Feb. 2013, 4 pgs.
Borneman, Troy W., et al., "Application of optimal control to CPMG refocusing pulse design", Journal of Magnetic Resonance In Press, Corrected Proof, pp. 220-233, ISSN 1090-7807, 2010, 14 pgs.
Borneman, Troy W., et al., "Bandwidth-limited control and ringdown suppression in high-Q resonators", Journal of Magnetic Resonance 225, pp. 120-129, ISSN 1090-7807, 2012, 10 pgs.
Borneman, Troy W, et al., "Bandwith-Limited Control and Ringdown Suppression in High-Q Resonators", http://arXiv:1207.1139v2 [quant-ph], Jan. 21, 2013, 20 pages.
Borneman, et al., "High-Fidelity Control in High-Q Resonators", arXiv:1207.1139v1 [quant-ph], Jul. 4, 2012, 15 pgs.
Borneman, T.W., et al., "Parallel Information Transfer in a Multinode Quantum Information Processor", Physical Review Letters 108, 140502, 2012, 5 pgs.
Borneman, "Techniques for Noise Suppression and Robust Control in Spin-Based Quantum Information Processors", Dept. of Nuclear Science and Engineering, MIT, Dec. 2012, 160 pgs.
Cappellaro, P., et al., "Entanglement Assisted Metrology", Physical Review Letters 94, 020502, 2005, 4 pgs.
Cory, D.G., et al., "Electron Spin Control with High Q Superconducting Resonators", Abstract submitted on Mar. 21, 2017 to the 20th Meeting of the International Society of Magnetic Resonance (ISMAR 2017) conference in Quebec City, Canada, Mar. 21, 2017, 1 pg.
Dahm, T., et al., "Theory of intermodulation in a superconducting microstrip resonator", Journal of Applied Physics 81, 2002, ISSN 0021-8979, 1996, 9 pgs.
D'Alessandro, Domenico, "Introduction to quantum control and dynamics", CRC press, pp. 81-82, 2007, 8 pgs.
Day, Peter K., et al., "A broadband superconducting detector suitable for use in large arrays", Nature 425, pp. 817-821, ISSN 0028-0836, 2003, 5 pgs.
Dolde, et al., "High Fidelity Spin Entanglement Using Optimal Control", arXiv:1309.4430, Sep. 17, 2013, 16 pgs.
Dolde, et al., "High-fidelity spin entanglement using optimal control", Nature Communications;, Feb. 28, 2014.
Egger, D.J., et al., "Adaptive Hybrid Optimal Quantum Control for Imprecisely Characterized Systems", Physical Review Letters 112, 240503, 2014, 5 pgs.
Fortunato, Evan M., et al., "Design of strongly modulating pulses to implement precise effective Hamiltonians for quantum information processing", The Journal of Chemical Physics 116, pp. 7599-7606, ISSN 0021-9606, 1089-7690, 2002, 9 pgs.
Fowler, Austin G., et al., "High-threshold universal quantum computation on the surface code", Physical Review A 80, 052312, 2009, 14 pgs.
Franck, et al., "Active Cancellation—A Means to Zero Dead-Time Pulse EPR", J Magn Reson., Dec. 2015, 15 pgs.
Goerz, Michael H., et al., "Optimal control theory for a unitary operation under dissipative evolution", New Journal of Physics 16, 055012, ISSN 1367-2630, 2014, 29 pgs.
Gottesman, Daniel, "An Introduction to Quantum Error Correction and Fault-Tolerant Quantum Computation", http://arXiv:0904.2557v1 [quant-ph], Apr. 2009, 46 pgs.
Granade, C. E., "Characterization, Verification and Control for Large Quantum Systems", Ph.D. thesis, University of Waterloo, Waterloo, ON, 2014, 259 pgs.
Granade, et al., "Practical Characterization and Control of Quantum Systems", http://nbviewer.jupyter.org/github/cgranade.github.io/blob/master/research/talks/sandia-2014/slides.ipynb, Jan. 7, 2018, 21 pgs.
Granade, Christopher, et al., "Practical Characterization and Control of Quantum Systems", Institute for Quantum Computing, Jun.

(56) References Cited

OTHER PUBLICATIONS 16, 2014, sections "Abstract"—"Conclusions", retrieved online on Oct. 26, 2015 from http://nbviewer.ipython.org/github/cgranade/cgranade.github.io/blob/master/research/talks/sandia-2014/slides.ipynb, Jun. 16, 2014, 21 pgs.

Granade, et al., "Practical Characterization and Control of Quantum Systems", Seminar at Sandia National Laboratories; Christopher Granade Inst. for Quantum Computing, Jun. 24, 2014, 13 pgs.

JPO, Office Action dated Feb. 28, 2022, in JP 2021-503051, 4.

CIPO, Office action dated Oct. 4, 2022, in CA 3,104,011, 4 pgs.

Abragam, A., "The Principles of Nuclear Magnetism", Oxford University Press, Chapters 1, 2, and 3, 1961, 62 pages.

Hincks, I.N., et al., "Controlling Quantum Devices with Nonlinear Hardware", Physical Review Applied, vol. 4 No. 024012, 2015, 8 pages.

Nielsen, Michael A., et al., "Quantum Computation and Quantum Information", Cambridge University Press, 10th Anniversary Edition, Chapters 1 and 8, 2000, 203 pages.

Zmuidzinas, Jonas, "Superconducting Microresonators: Physics and Applications", Annual Review of Condensed Matter Physics, vol. 3, 169-214, 2012, 48 pages.

EPO, Communication pursuant to Article 94(3) EPC issued in Application No. 18927656.1 on Jun. 2, 2023, 16 pages.

Abragam, A., "The Principles of Nuclear Magnetism", Oxford University Press, Chapters 1, 2, and 3, 1961, 63 pages.

Nielsen, Michael A., et al., "Quantum Computation and Quantum Information", Cambridge University Press, 10th Anniversary Edition, Chapters 1 and 8, 2000, 139 pages.

\* cited by examiner

US 11,959,984 B2

MODEL-INSENSITIVE CONTROL OF NONLINEAR RESONATORS

CROSS-REFERENCE TO RELATED APPLICATIONS

This application is a continuation of PCT/CA2018/050903, filed Jul. 25, 2018, and entitled "Model-Insensitive Control of Nonlinear Resonators," the disclosure of which is hereby incorporated by reference.

BACKGROUND

The following description relates to model-insensitive control of resonators, such as in a magnetic resonance system.

Electromagnetic fields are often used to control spin systems, such as ensembles of nuclear spins or electron spins. For example, a sequence of electromagnetic pulses may be applied to a spin system to control the state of the spin system. However, during application to the spin system, the sequence of electromagnetic pulses may experience deviations from a desired target characteristic that produce distortions, which can degrade control of the spin system.

DETAILED DESCRIPTION

Figure 1:
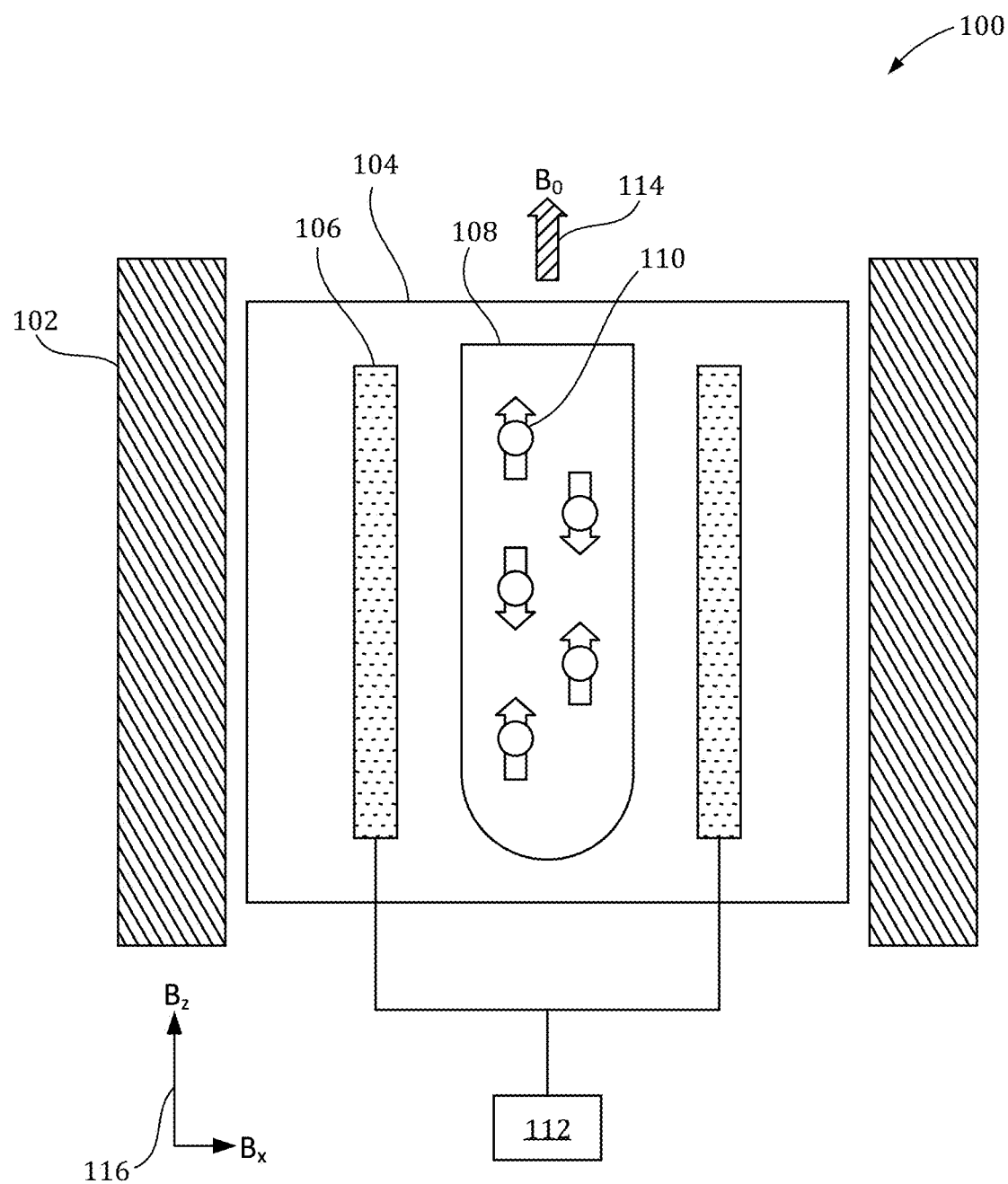
FIG. 1 is a schematic diagram of an example magnetic resonance system.

FIG. 1 presents a schematic diagram of an example magnetic resonance system 100. The example magnetic resonance system 100 shown in FIG. 1 includes a primary magnet system 102, a cooling system 104, a resonator 106, a sample 108 that contains spins 110, and a control system 112. The magnetic resonance system 100 may include additional or different features, and the components of the magnetic resonance 100 system can be arranged as shown in FIG. 1 or in another manner. In some instances, the resonator 106 may be configured as a cavity or another type of resonance structure (e.g. a coil).

The resonator 106 can be used to control the spins 110 of the sample 108. The resonator 106 generates a magnetic field in response to receiving a first pulse from the control system 112. The resonator 106 applies the magnetic field to the spins 110 of the sample 108 over a first period. The first period of the first pulse is selected such that the resonator 106 maintains the magnetic field in a transient state during the first period. The resonator 106 also receives a second pulse from the control system 112 immediately following the first period. The resonator alters a magnitude of the magnetic field to zero in response to receiving the second pulse from the control system 112. Such alteration occurs over a second period of the second pulse. Further details on the resonator's 106 control of the spins 110 are described below.

The example primary magnet system 102 generates a static, uniform magnetic field, labeled in FIG. 1 and referred here to as the $B_0$ field 114. The example primary magnet system 102 shown in FIG. 1 can be implemented as a superconducting solenoid, an electromagnet, a permanent magnet or another type of magnet that generates a static magnetic field. In FIG. 1, the example $B_0$ field 114 is homogeneous over the volume of the sample 108 and oriented along the z direction (also referred to here as the "axial direction") of the axisymmetric reference system 116.

In the example shown in FIG. 1, the spin system can be any collection of particles having non-zero spin that interact magnetically with the applied fields of the magnetic resonance system 100. For example, the spin system can include be an ensemble of nuclear spins, electron spins, or a combination of nuclear and electron spins. Examples of nuclear spins include hydrogen nuclei ($^1H$), carbon-13 nuclei ($^{13}C$), and others. In some implementations, the spin ensemble is a collection of identical spin-½ particles.

The resonator 106 can generate a Rabi field that is applied to the spin ensemble 108 resides in the $B_0$ field 114. In combination with the internal Hamiltonian of the spin system, the Rabi field can provide universal control of the spin ensemble. In some implementations, any magnetic resonance experiment or pulse sequence can be implemented in this manner. The resonator can generate the Rabi field, for example, based on signals from the control system 112, and the parameters of the Rabi field (e.g., the phase, power, frequency, duration, etc.) can be determined at least partially by the signal from the control system 112.

Figure 2:
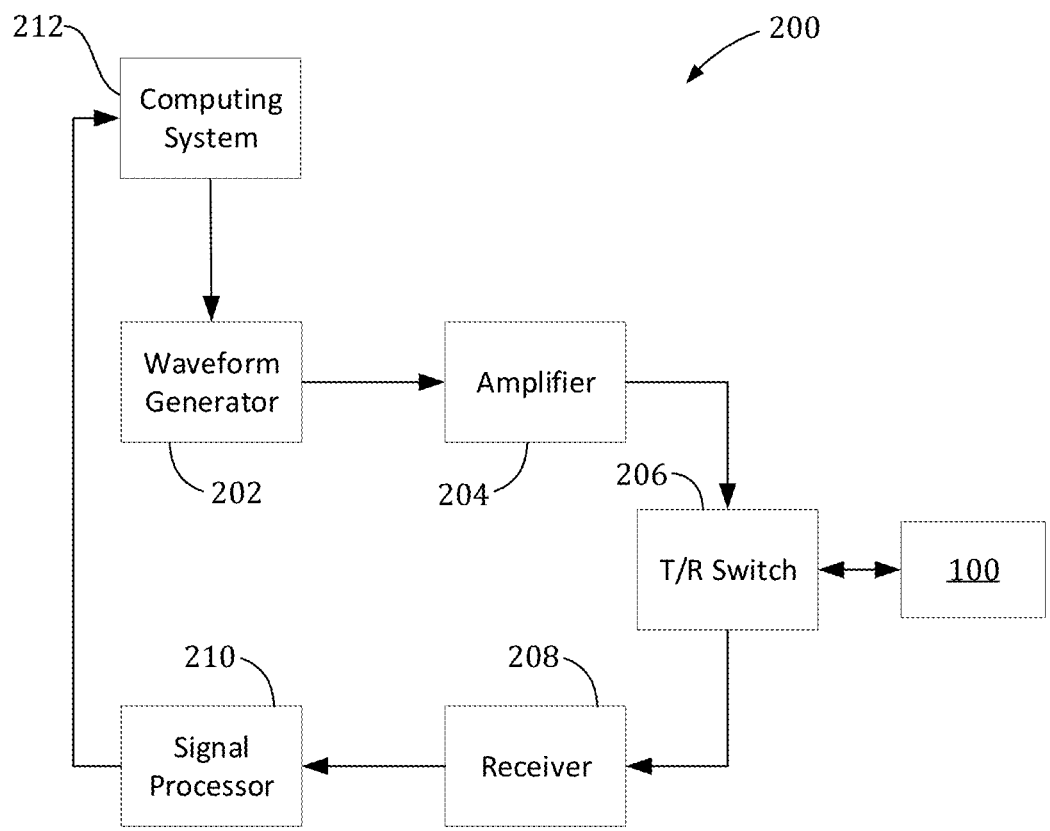
FIG. 2 is a schematic diagram of an example control system for the example magnetic resonance system of FIG. 1.

FIG. 2 presents a schematic diagram of an example control system 200 for the magnetic resonance system 100 of FIG. 1. The control system 200 of FIG. 2 is analogous to the control system 112 of FIG. 1. The control system 200 includes a waveform generator 202, an amplifier 204, a transmitter/receiver switch 206, a receiver 208, a signal processor 210, and a computer system 212. The control system 200 can include additional or different features, and the features of the control system 200 can be configured to operate as shown in FIG. 2 or in another manner.

The computing system 212 can be (or include) a computer, a digital electronic controller, a microprocessor or another type of data-processing apparatus. The computing system 212 can include memory, processors, and may operate as a general-purpose computer, or the computing system 212 can operate as an application-specific device.

In some implementations, magnetic resonance measurements of inductively-coupled spin ensembles (e.g., the spins 110 of FIG. 1) may be quantified by a sensitivity and a signal-to-noise ratio. The sensitivity and signal-to-noise ratio increase as the square root of the cavity quality factor, Q. Resonators having a high quality factor are desirable for detecting spin samples, such as those used for quantum information processing and biological magnetic resonance. A feature of typical high-Q resonators is their reactive response to an applied voltage pulse. This reactive response may be modeled by algorithms for numerical pulse optimization to yield control sequences for high-Q resonators. The resulting control sequences may allow a desired behavior at a high quality factors and efficiently remove stored energy in the high-Q resonator.

A convenient means of achieving high quality factors is by using a resonator that includes a superconducting thin film. The superconducting thin film may also allow mode volumes appropriate for microscale spin samples. However, the superconducting thin films, when strongly-driven, respond nonlinearly to the applied voltage signal (or pulse), which results in the generated magnetic field also responding non-linearly. The source of such nonlinearities varies and may include kinetic inductance, non-equilibrium quasiparticle distribution, vortex creation and motion, and finite critical current, among others.

Resonator nonlinearities may be included in algorithms for numerical pulse optimization that produce control sequences giving a desired behavior at a high quality factor. The desired behavior occurs in the presence of resonator nonlinearities and allows the efficient removal stored energy in the cavity. A drawback of this method is the precision and accuracy to which a model of resonator nonlinearities must be defined. In general, parameterizing such a model is demanding and inexact. Moreover, parameters of the model may be a function of the generated magnetic field, characteristics of the sample, temperature, microwave power, and even the details (or residual effects) of prior measurements.

The example magnetic resonance system 100 and example control system 200 of respective FIGS. 1 and 2 may operate in a manner that allows the design of shaped microwave pulses for a robust and coherent control of quantum systems which include high quality factor resonance circuits. The shaped microwave pulses can be substantially insensitive to variations in the parameters that define linear or nonlinear control circuitry. In some instances, the systems 100, 200 may operate in a manner that allows the removal hysteretic effects in the shaped microwave pulses applied to nonlinear control circuitry.

In some examples, the shaped microwave pulses include piecewise-constant periods of amplitude and phase modulation applied at a carrier frequency resonant with the resonator. The piecewise-constant periods may correspond to voltage or current signals. Moreover, each period may be chosen in length such that a resonator impulse response may be modeled approximately by a linear kernel. In some implementations, the periods are also chosen in length to allow the resonator impulse response to be modeled approximately by a non-linear set of mathematical expressions (e.g., a set of non-linear differential equations). The shaped microwave pulses allow a resulting magnetic field at the end of each period to be forced to zero to suppress hysteretic effects. In other words, each period of the shaped microwave pulses can be 'ringdown suppressed' to mitigate hysteretic effects.

Figure 3A:
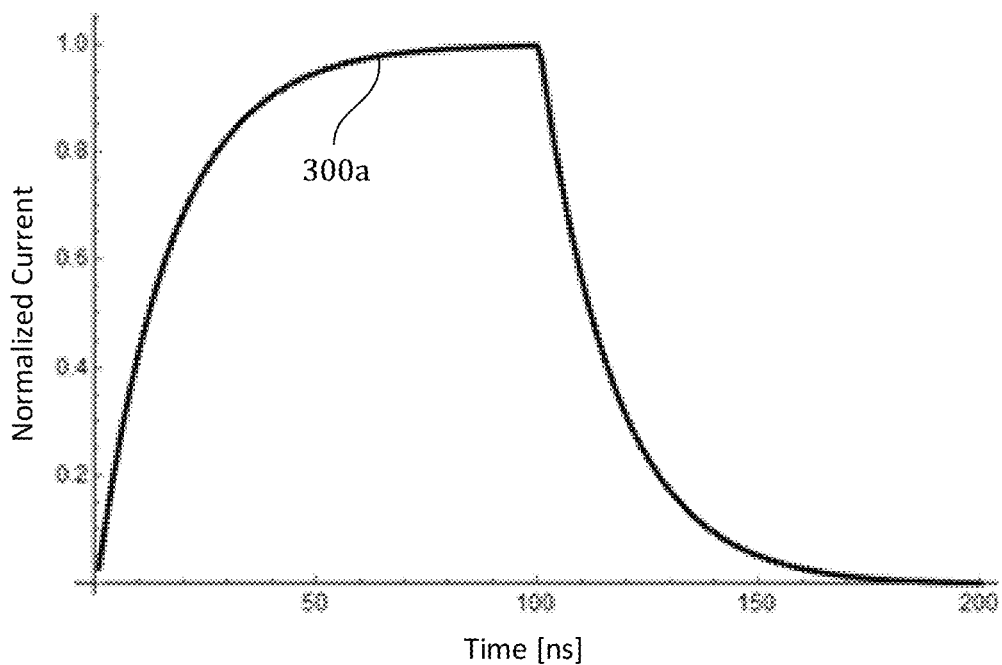
FIG. 3A is a graph of a normalized current amplitude of a simulated transient response to a 100-ns square pulse excitation of zero phase, according to an example.
Figure 3B:
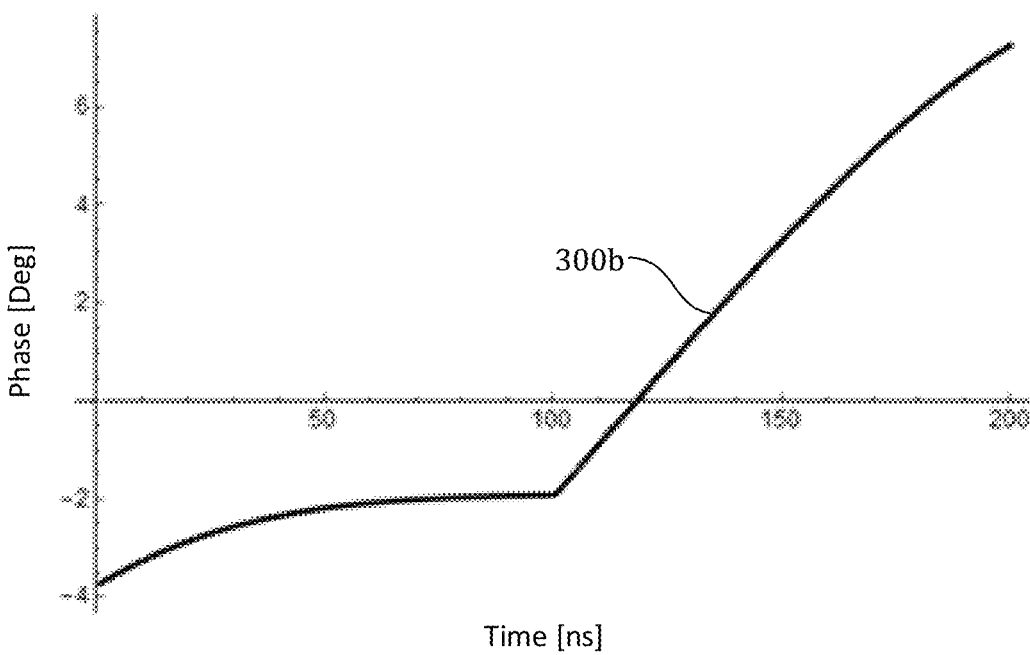
FIG. 3B is a graph of a phase of the normalized current amplitude of FIG. 3A, according to an example.

FIGS. 3A and 3B present graphs of, respectively, a normalized current amplitude 300a and a corresponding phase 300b of a simulated transient response to a 100-ns square pulse excitation of zero phase, according to an example. The transient response is simulated using an example model (e.g., an electric circuit model). The normalized current amplitude 300a and corresponding phase 300b are presented as a function of time. FIGS. 3A and 3B show the transient response for a linear resonator demonstrating the exponential rise and fall of an inductor current due to a finite reactance of the example model.

In general, the time-dependent quadrature amplitudes of a magnetic field applied to a spin system will differ significantly from a shape of an applied voltage pulse received by a resonator. For example, as shown in FIG. 3A, a square voltage pulse generates a magnetic field with exponential rising and falling edges, $e^{-t/\tau}$. The time-constant, $\tau$, of the exponential is related to Q and the resonance frequency, $\omega_0$, through the mathematical expression of Equation (1):

$$\tau = Q/\omega_0 \qquad (1)$$

Here, Q is defined as the full-width-half-max linewidth of the resonance line-shape divided by the resonance frequency, or alternatively, by the ringdown time-constant, $\tau$.

In some systems, high-fidelity control of spin systems depends upon a precise knowledge of the time-dependent shape of the control magnetic fields. For a linear resonator, the magnetic field transient response, i(t), to a given impulse, v(t), is given by the convolution of a linear kernel, h(t), with v(t), which is scaled by a constant conversion factor, C. Equation (2) presents the magnetic field transient response, i(t):

$$i(t)=C(h(t)*v(t))=C\int_{-\infty}^{\infty}h(t-\tau)v(\tau)d\tau \quad (2)$$

The linear kernel, h(t), describing the resonator impulse response may be either calculated using a model or measured. When the resonator contains non-linear elements, a convolution is no longer sufficient and, in general, a set of coupled non-linear differential state equations describing a circuit transient response may be solved. One example of a non-linear resonator is a superconducting thin-film resonator that exhibits a kinetic inductance non-linearity due to the ballistic motion of Cooper electron pairs. A common model of kinetic inductance is to replace a linear inductor in a circuit model with a current-dependent inductor parameterized by $\alpha_L(I_c)$, where $I_c$ is the critical current of the film and K is a dimensionless constant. Equations (3) and (4) present mathematical expressions of one possible replacement:

$$L(i)=L_0(1+\alpha_L|i|^2) \quad (3)$$

$$\alpha_L=K/I_c^2 \quad (4)$$

The term $\alpha_L$ may be used to characterize a non-linear behavior of an electrical circuit, and more specifically, a non-linear behavior of an inductor. For example, the term $\alpha_L$ may be used with an electric circuit model and Equations (3) and (4) may describe a transient response of a resonator operating in a non-linear regime.

Figure 3C:
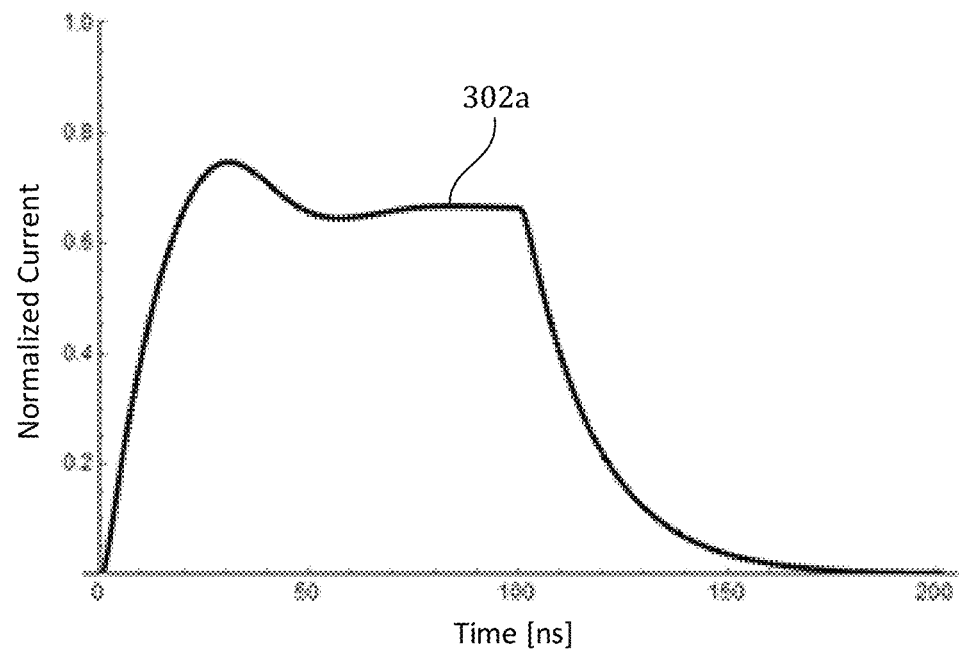
FIG. 3C is a graph of a normalized current amplitude of a simulated transient response to a 100-ns square pulse excitation of zero phase, but in which an inductance is non-linear, according to an example.
Figure 3D:
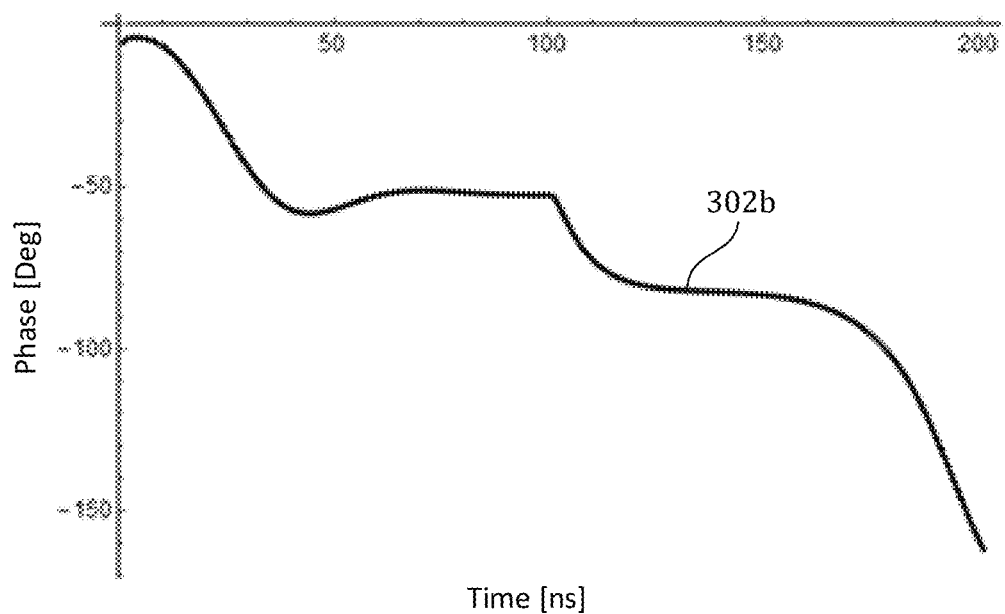
FIG. 3D is a graph of a phase of the normalized current amplitude of FIG. 3C, according to an example.

FIGS. 3C and 3D present graphs of, respectively, a normalized current amplitude 302a and a corresponding phase 302b of a simulated transient response to a 100-ns square pulse excitation of zero phase, according to an example. The transient response is simulated using an example model (e.g., an electric circuit model). The normalized current amplitude 302a and corresponding phase 302b are presented as a function of time. FIGS. 3C and 3D show the simulated transient response for a resonator with a nonlinear inductor ($\alpha_L$=0.01), demonstrating a power-dependent shift of the resonator frequency and coupling.

A number of key features of general non-linear transient response emerge from the kinetic inductance model represented by Equations (3) and (4). In the frequency domain, resonator S-parameter measurements become power-dependent and exhibit increased skew for higher drive powers, eventually resulting in a bi-stable resonance and, ultimately, loss of superconductivity. In the time-domain, the simple exponential rise and fall of the magnetic field transients become significantly more complex as the resonator is driven into the non-linear regime.

Figure 4:
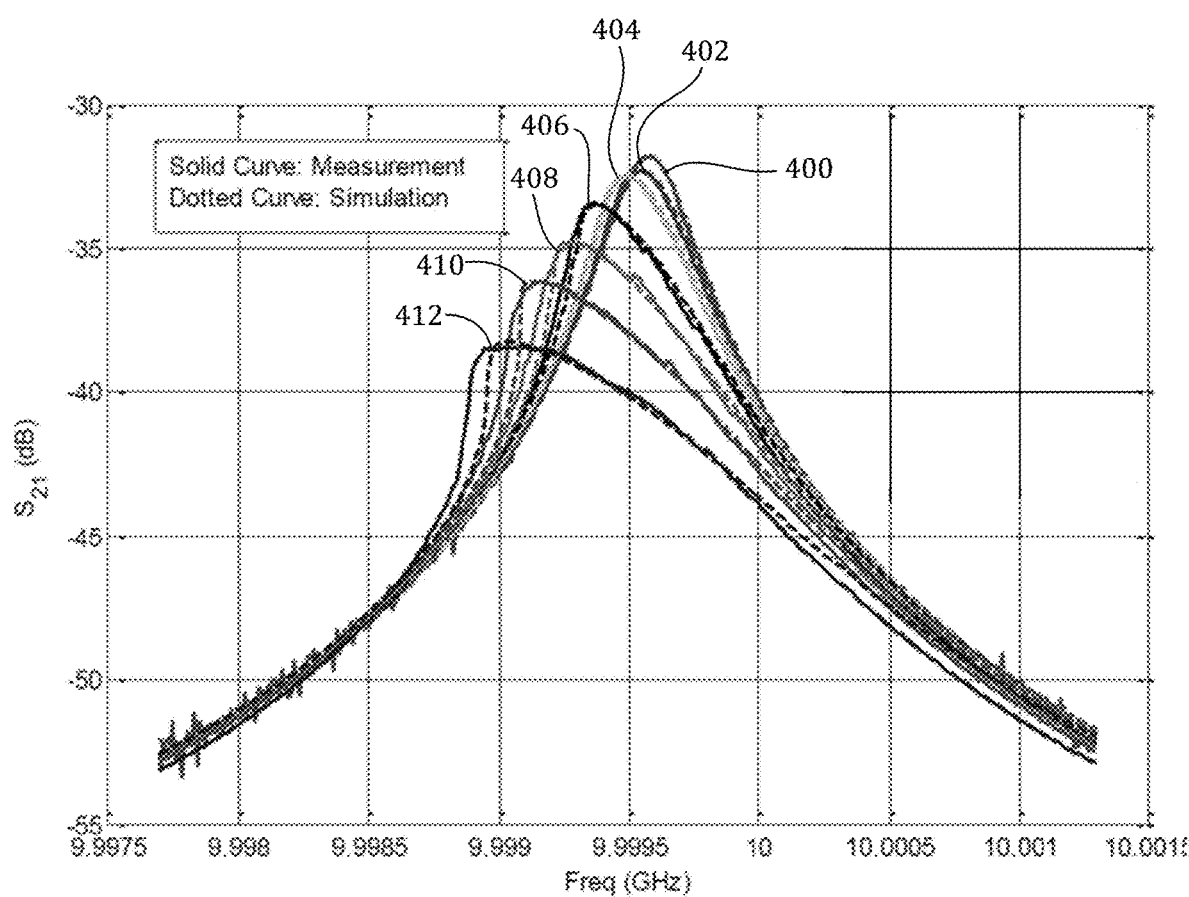
FIG. 4 a graph of measurements and corresponding simulated measurements, taken by a vector network analyzer (VNA), of a frequency response of a superconducting Nb thin-film resonator at various input power levels, $P_{in}$.

FIG. 4 presents a graph of example measurements and corresponding simulated measurements, taken by a vector network analyzer (VNA), of a frequency response of a superconducting Nb thin-film resonator at various input power levels, $P_{in}$. The ordinate is shown in units of power (dBm) for a transmitted signal ($S_{12}$) and the abscissa is shown in units of frequency (GHz). The input power levels are progressively increased by the vector network analyzer from −30 dBm, to −20 dBm, to −15 dBm, to −10 dBm, to −7 dBm, to −4 dBm, to −1 dBm. Solid lines correspond to measured data and dotted lines correspond to fitting of an example model using harmonic balance techniques. Numerals indicate pairs of measured and simulated data curves at various power levels: Numerals 400, 402, 404, 406, 408, 410, and 412 indicate pairs of measured and simulated data curves at power levels of −30 dBm, −20 dBm, −15 dBm, to −10 dBm, −7 dBm, −4 dBm, and −1 dBm, respectively. The small-signal (linear) Q of the resonator is approximately 30,000 at a temperature of 1.2 K. As the input power is increased, the resonance shape of the frequency response deviates from Lorentzian (linear) behavior and the resonance frequency and coupling decrease.

Figure 5A:
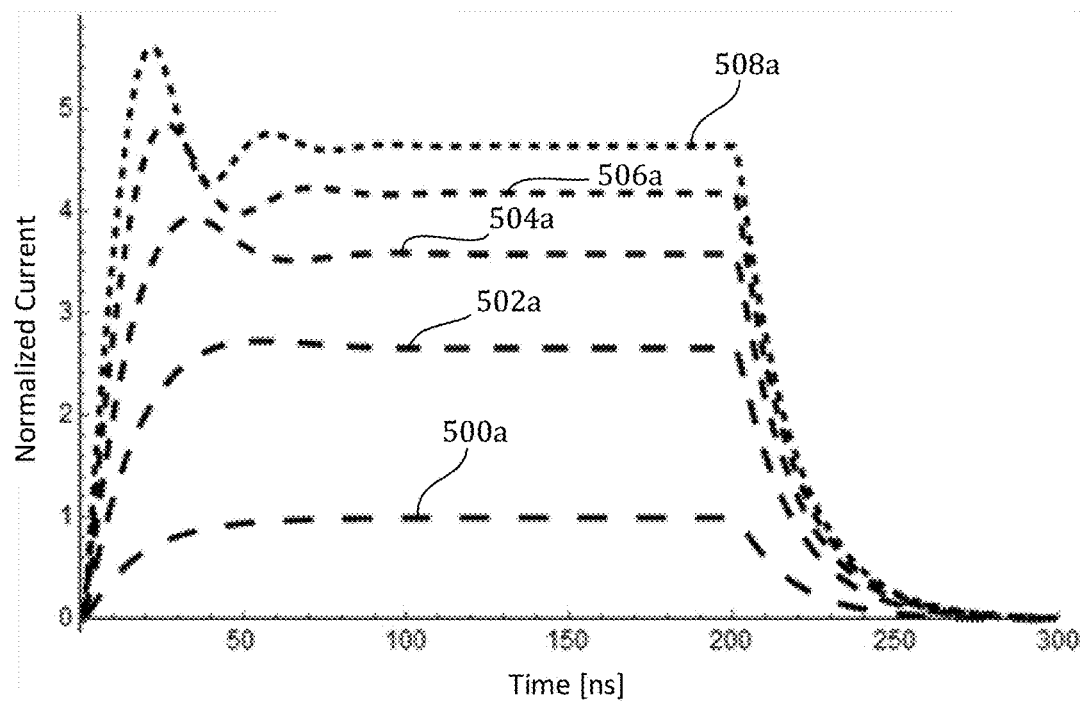
FIG. 5A is a graph of normalized current amplitudes, at various power levels, of a simulated transient response of a non-linear resonator excited by a 200-ns square pulse of zero phase, according to an example.
Figure 5B:
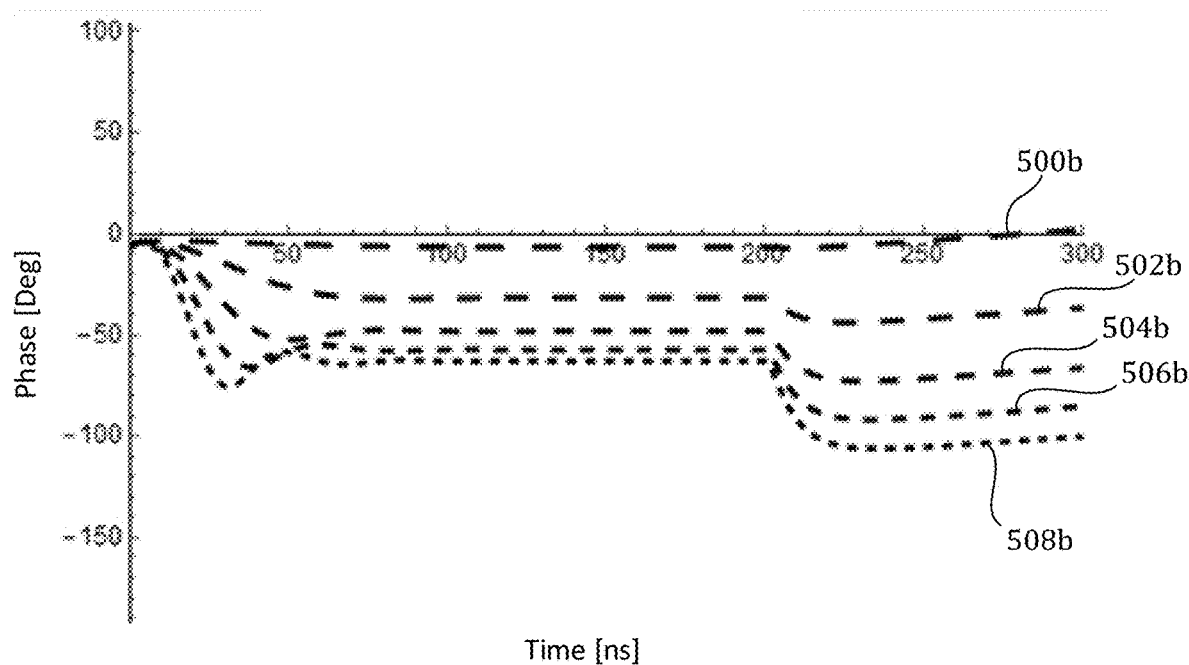
FIG. 5B is a graph of respective phases of the normalized current amplitudes of FIG. 5A, according to an example.

FIGS. 5A and 5B present graphs of, respectively, normalized current amplitudes 500a, 502a, 504a, 506a, 508a and corresponding phases 500b, 502b, 504b, 506b, 508b, at various power levels, of a simulated transient response of a non-linear resonator excited by a 200-ns square pulse of zero phase, according to an example. The normalized current amplitudes 500a, 502a, 504a, 506a, 508a and phases 500b, 502b, 504b, 506b, 508b are presented as a function of time, and hence, in the time domain. The 200-ns square pulse progressively increases in amplitude from 0.1 V, to 0.3 V, to 0.5 V, to 0.7 V, to 0.9 V, as shown by respective curves 500a, 502a, 504a, 506a, 508a and respective curves 500b, 502b, 504b, 506b, 508b. The effect of the resonance frequency being pulled downward and a decrease in coupling is apparent in oscillations at a beginning of the transient response and the non-linear scaling of a steady-state amplitude. A steady-state phase distortion asymptotically approaches 90 degrees.

Figure 6A:
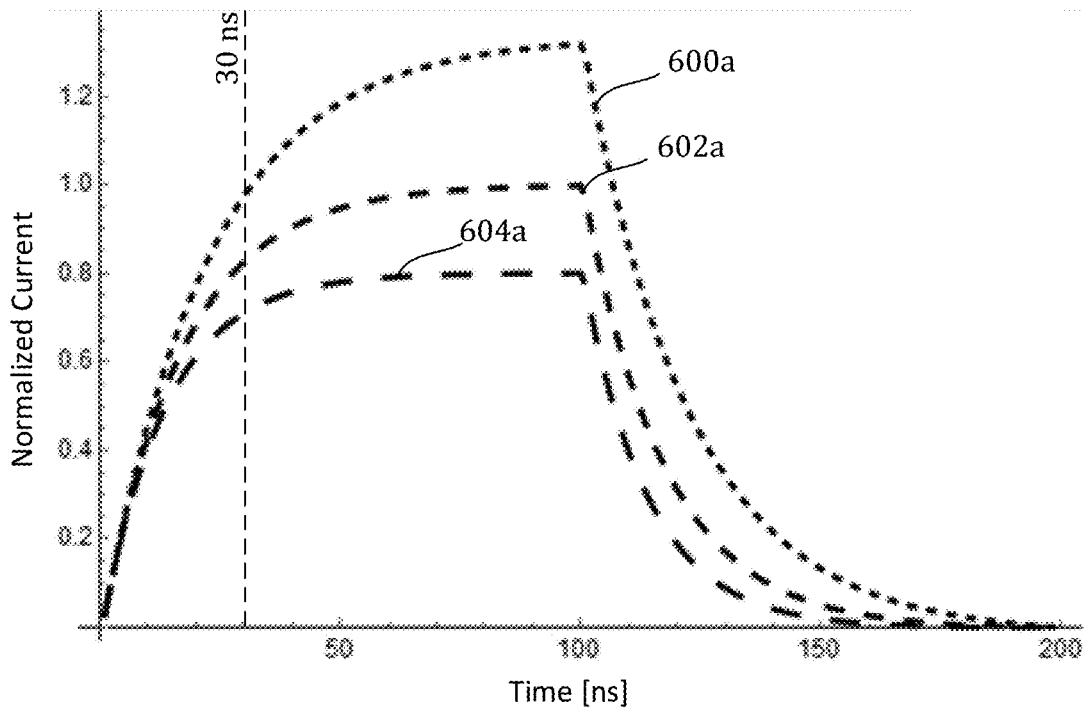
FIG. 6A is a graph of normalized current amplitudes, at various Q values, of a simulated transient response of a non-linear resonator excited by a 100-ns square pulse of zero phase, according to an example.
Figure 6B:
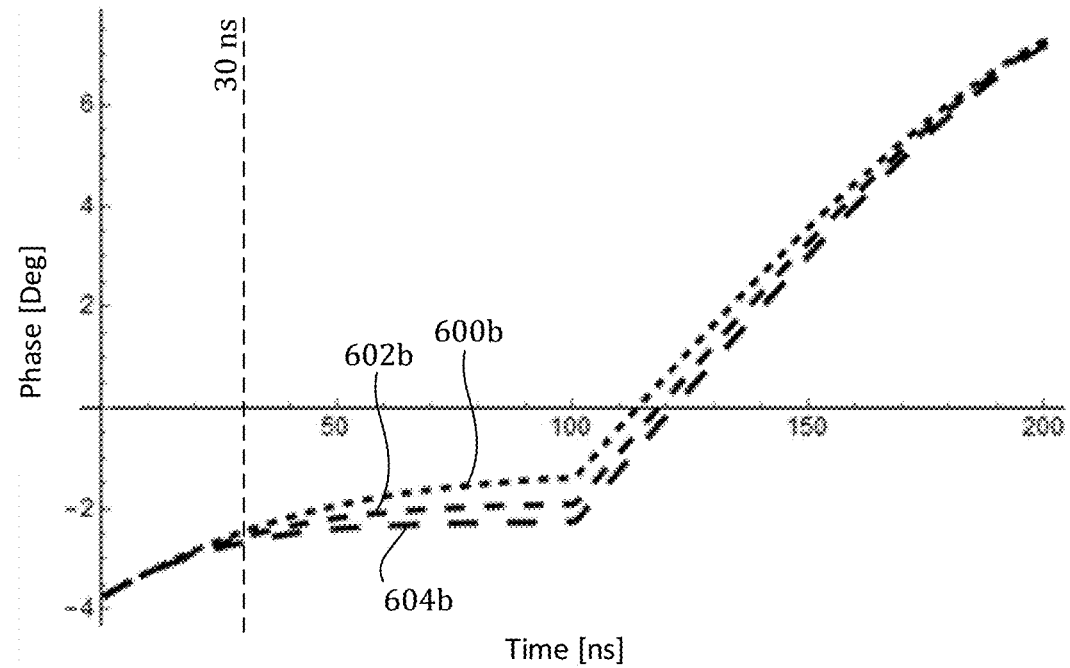
FIG. 6B is a graph of respective phases of the normalized current amplitudes of FIG. 6A, according to an example.

In some cases, the complexity of the transient response leads to a high degree of sensitivity to variations of the model parameters used to calculate the response. For example, as shown in FIGS. 6A and 6B for a high-Q linear resonator, the same input signal can lead to significantly different output magnetic fields when there is variation or uncertainty in the value of Q. FIGS. 6A and 6B present graphs of normalized current amplitudes 600a, 602a, 604a and corresponding phases 600b, 602b, 604b, at various Q values, of a simulated transient response of a non-linear resonator excited by a 100-ns square pulse of zero phase, according to an example. The transient response is simulated via an example model (e.g., an electric circuit model). In the simulation, the quality factor is progressively decreased from Q=2000, to 1000, to 750, as shown by respective data curves 600a, 602a, 604a and respective data curves 600b, 602b, 604b. In the simulation, r is also increased from 0.005Ω, to 0.01Ω, to 0.015Ω. The normalized current amplitudes and phases are presented as a function of time. As shown by FIGS. 6A and 6B, after about 30 ns the output the magnetic field applied by the resonator for the same input voltage pulse depends strongly on Q.

Figure 7A:
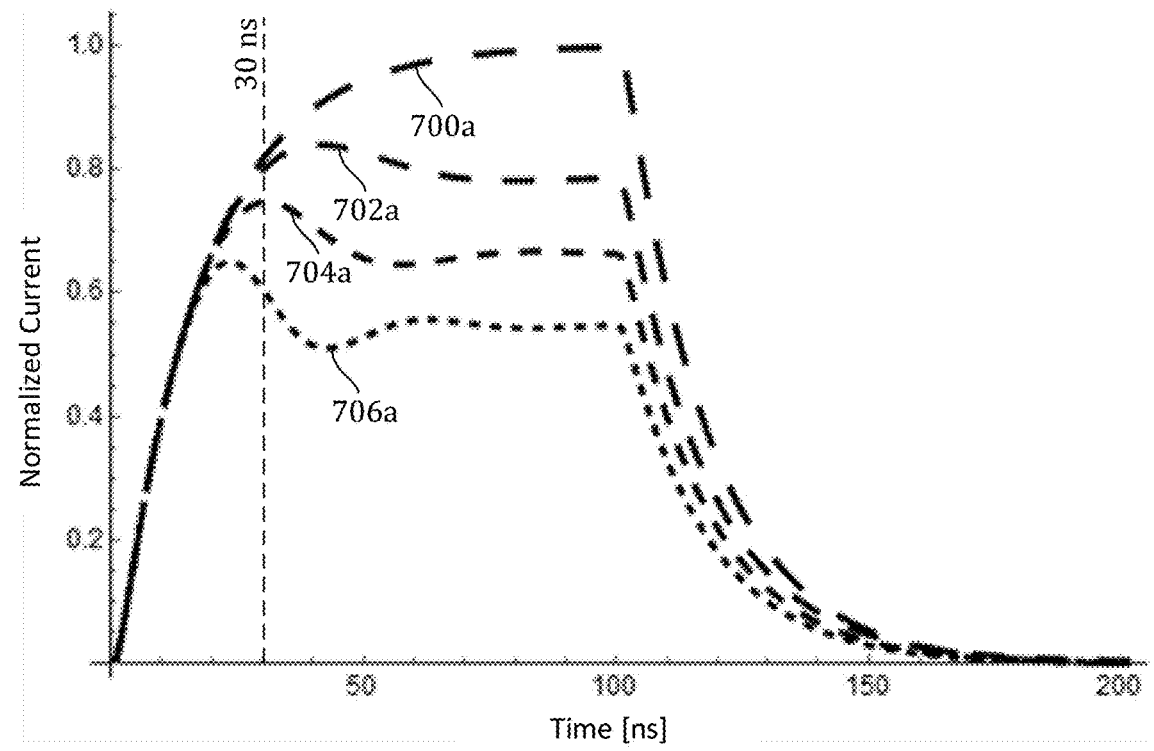
FIG. 7A is a graph of normalized current amplitudes, at various $\alpha_L$ values, of a simulated transient response of a non-linear resonator excited by a 100-ns square pulse of zero phase, according to an example.
Figure 7B:
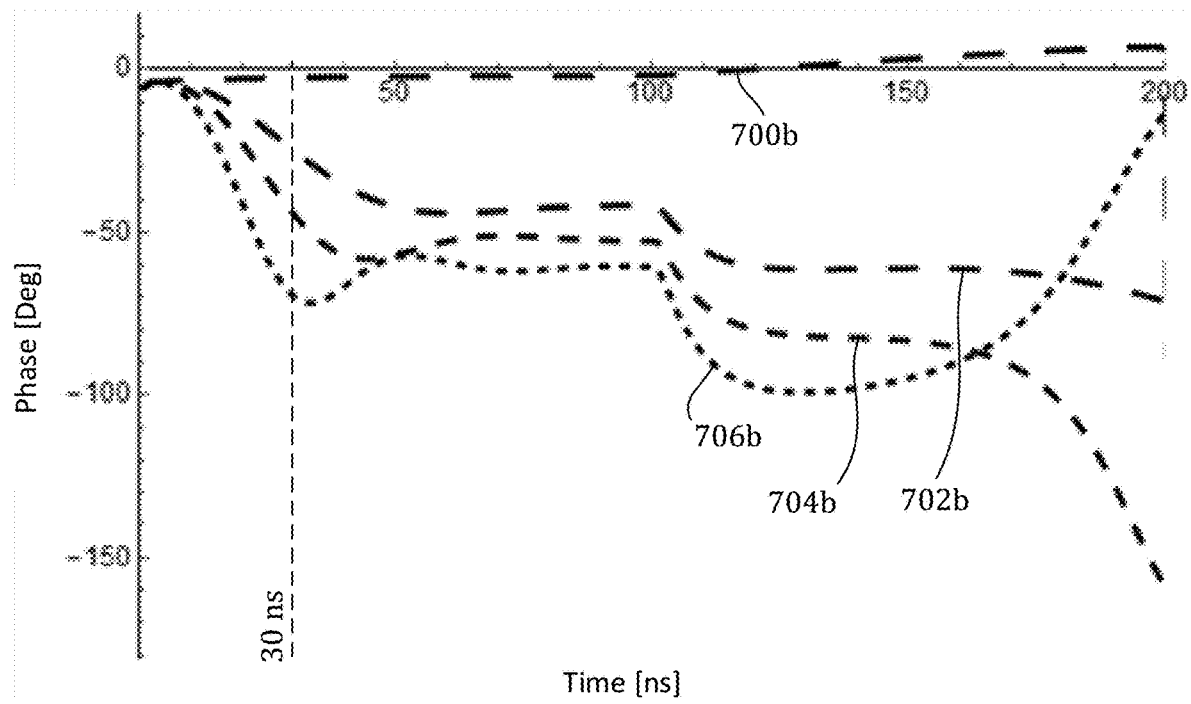
FIG. 7B is a graph of respective phases of the normalized current amplitudes of FIG. 7A, according to an example.

The strong dependence of the output magnetic field on resonator parameters is also apparent for a non-linear resonator with varying or uncertain $\alpha_L$. The term $\alpha_L$ characterizes a non-linear behavior of an electrical circuit used to model the non-linear resonator. FIGS. 7A & 7B present graphs of normalized current amplitudes 700a, 702a, 704a, 706a and corresponding phases 700b, 702b, 704b, 706b, at various $\alpha_L$ values, of a simulated transient response of a non-linear resonator excited by a 100-ns square pulse of zero phase, according to a representative example. The transient response is simulated using an example model (e.g., an electric circuit model). In particular, a non-linear inductance is represented by Equation (3) where $\alpha_L$=0, 0.005, 0.01, and 0.02, as shown by respective data curves 700a, 702a, 704a, 706a and respective data curves 700b, 702b, 704b, 706b. Similar to FIGS. 6A and 6B for variations of linear resonator Q after approximately 30 nanoseconds, the output magnetic field for the same input voltage pulse depends strongly on $\alpha_L$.

In some implementations, the parameter-dependent transient response varies the most when the transient response reaches steady-state. As shown in FIGS. 6A-7B, an initial portion of the simulated transient response is insensitive to a variation of model parameters. To generate model-insensitive control pulses then, a voltage pulse to the resonator can be stopped before the magnetic field applied by the resonator reaches steady-state (as represented by the normalized current in FIGS. 6A-7B). Moreover, the voltage pulse can be appended with a ringdown-suppression pulse to actively drive the applied magnetic field to zero.

Figure 8:
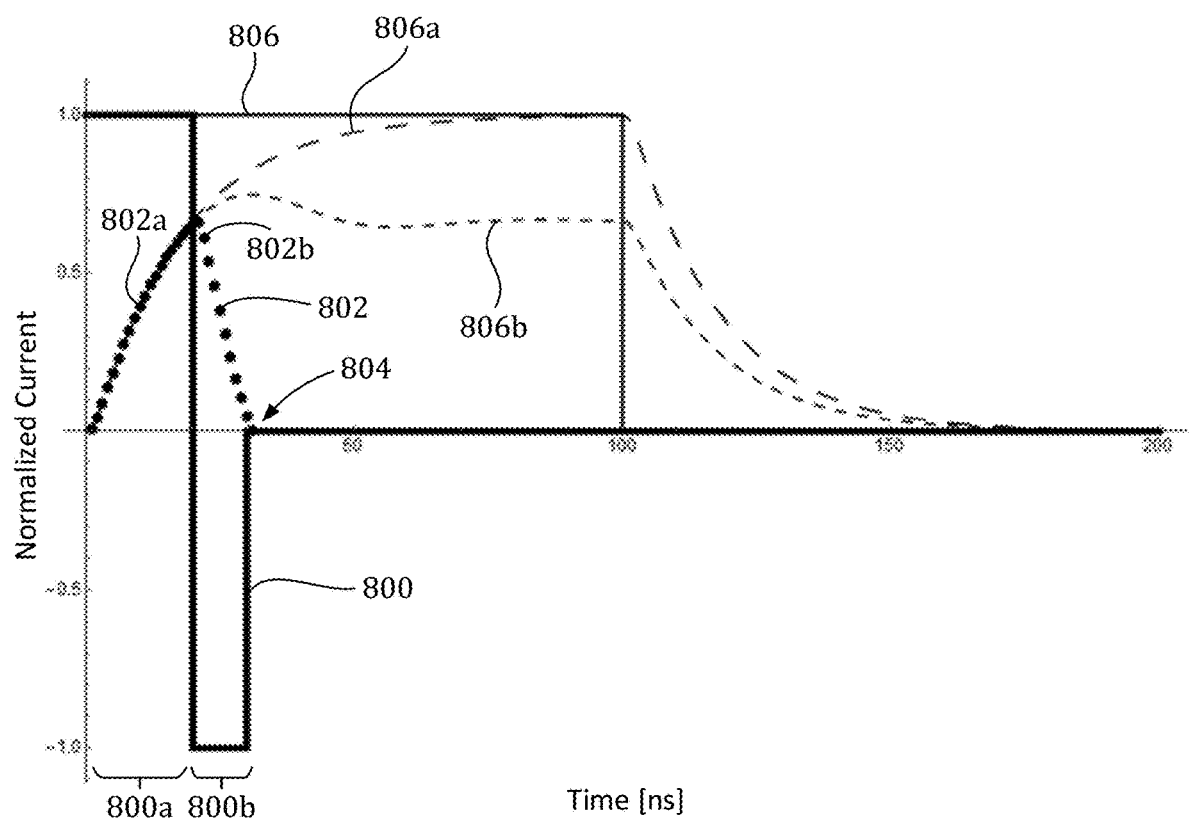
FIG. 8 is a schematic diagram of a pair of first and second pulses that correspond to a single model insensitive composite rotation (MICR) pulse, according to an example.

For example, FIG. 8 presents a schematic diagram of a pair of first and second pulses 800a, 800b that correspond to a single model insensitive composite rotation (MICR) pulse 800, according to an example. For clarity, only amplitude responses are shown in FIG. 8. The MICR pulse 800 is shown by a heavy solid black line that includes a first pulse 800a of 20 nanoseconds and a second pulse 800b of 10 ns. As shown in FIG. 8, the second pulse 800b immediately follows the first pulse 800a. A response of the magnetic field 802 to the MICR pulse 800 is shown by a dotted black line that includes a first response of the magnetic field 802a and a second response of the magnetic field 802b. A first period of the first pulse 800a is selected such that the first response of the magnetic field 802a is maintained in a transient state and does not enter steady-state behavior. The first period is selected so that an effect of the resonator reactance and non-linearity is not significant on the response of the magnetic field 802.

The second pulse 800b drives the inductor current to zero by an end of a second period 804, and as such, the second response of the magnetic field 802b is also driven to zero. The second pulse 800b thus serves as a ringdown suppression pulse that is appended to the first pulse 800a. Although FIG. 8 depicts the MICR pulse 800 as having only one second pulse 800b, the MICR pulse 800 may have more than one second pulse 800b, e.g., the second pulse 800b may include a plurality of second pulses. Moreover, although FIG. 8 depicts the second pulse 800b as a square pulse, other pulse shapes may be used. The second pulse 800b is generally more complex in shape than a simple 180-degree phase shift.

As shown in FIG. 8, the first pulse 800a starts at zero amplitude and the second pulse 800b ends at zero amplitude, thus the MICR pulse 800 starts and ends at zero amplitude. When configured in this manner, instances of the MICR pulse may be appended with arbitrary amplitude and phase in the same manner as magnetic resonance composite pulses. The appended instances are unaffected by hysteresis in non-linear control circuitry and allow composable quantum gates in the sense of quantum operations (e.g., for quantum computing). Such insensitivity to hysteresis and composability stem from the magnetic-field amplitude beginning and ending at zero.

In many implementations, successive pairs of first and second pulses 800a, 800b are concatenated together such that multiple MICR pulses of varying amplitude and phase define a control sequence. The control sequence can provide a robust coherent control of quantum systems, which include high quality factor (high Q) resonance circuits coupled to a spin system. Moreover, the MICR pulses in the control sequence can be insensitive to variations in parameters that define linear or non-linear control circuitry. The MICR pulses may also allow methods for removing hysteretic effects in shaped pulses applied to non-linear control circuitry.

By comparison, a basic square pulse 806 of 100 nanoseconds is shown by FIG. 8 as a thin solid line. A response of the magnetic field 806a to the basic square pulse 806, when driven by a resonator in a linear regime, is shown by a long-dashed line. Similarly, a response of the magnetic field 806b to the basic square pulse 806, when driven by the resonator in a non-linear regime, is shown by the short-dashed line. The increasing difference of the two responses 806a, 806b over the latter 80 nanoseconds of the basic square pulse 806 underscores the sensitivity of the basic square pulse 806 to variations in parameters that define the control circuitry of the resonator. This level of sensitivity is not found in the example MICR pulse 800. Moreover, unlike the MICR pulse 800, the two responses 806a, 806b each have uncontrolled decaying magnetic-field amplitudes that extend outside of the period of the basic square pulse 806. These decaying amplitudes may introduce artifacts into subsequent magnetic fields that are generated in response to corresponding subsequent pulses. The decaying amplitudes also prevent multiple instances of the basic square pulse 806 from being appended to each other without introducing artifacts in the magnetic field generated by the resonator. Such decaying amplitudes are not present in the example MICR pulse 800 shown in FIG. 8.

Control sequences defined by MICR pulses can allow magnetic-field control pulses to be generated that are insensitive to variations and uncertainties in model parameters without significantly reducing achievable Rabi drive strengths. For example, in response to a control sequence defined by MICR pulses, a resonator may apply a magnetic-field control pulse to perform a π rotation (or target operation) to a spin system in a homogenous magnetic field. The control sequence may be insensitive to non-linearities in an electrical circuit that includes a non-linear inductor, as represented by $\alpha_L$.

Figure 9A:
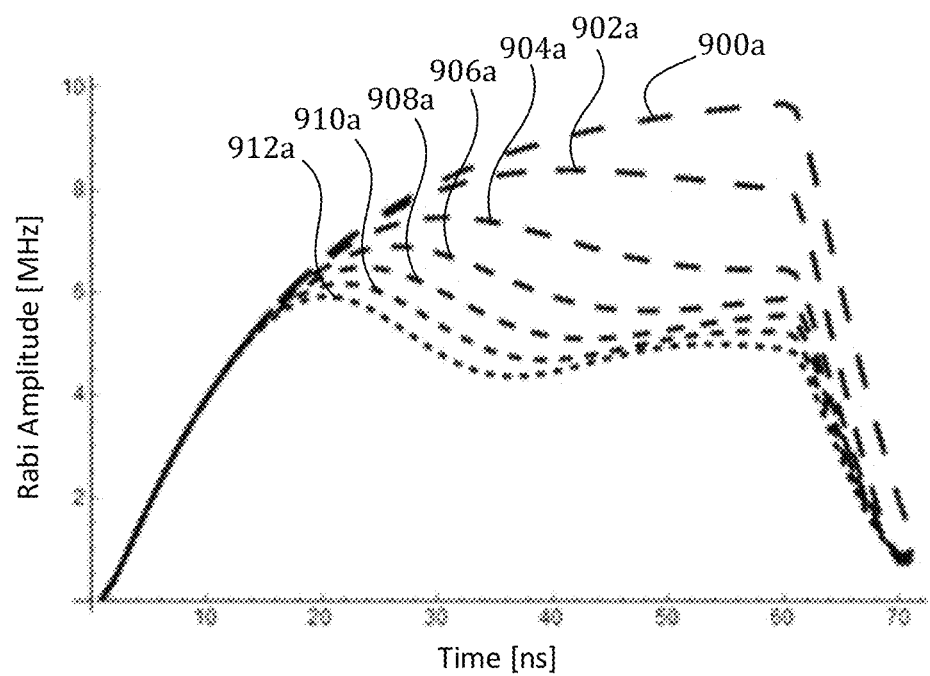
FIG. 9A is a graph of square Rabi drive amplitudes, at various $\alpha_L$ values, for a simulated transient response modeled using an example model, according to an example.
Figure 9B:
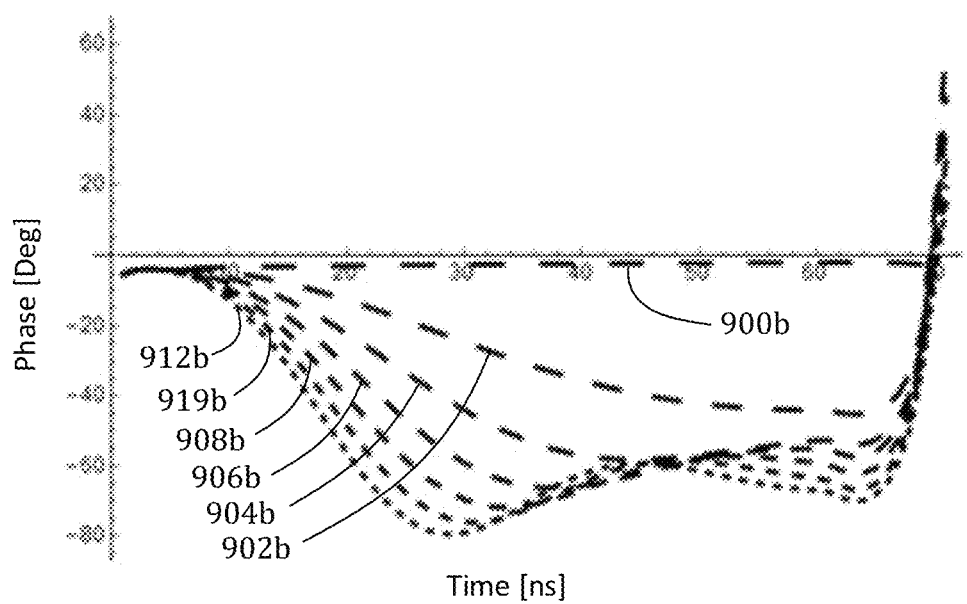
FIG. 9B is a graph of respective phases of the square Rabi drive amplitudes of FIG. 9A, according to an example.

FIGS. 9A-9B present graphs of square Rabi drive amplitudes 900a, 902a, 904a, 906a, 908a, 910a, 912a and corresponding phases 900b, 902b, 904b, 906b, 908b, 910b, 912b, at various $\alpha_L$ values, for a simulated transient response, according to an example. The transient response is simulated using an example model (e.g., an electric circuit model). In particular, a non-linear inductance is represented by Equation (3) where $\alpha_L$=0, 0.005, 0.01, 0.015, 0.02, 0.025, and 0.03 as shown by respective data curves 900a, 902a, 904a, 906a, 908a, 910a, 912a and respective data curves 900b, 902b, 904b, 906b, 908b, 910b, 912b.

Figure 9C:
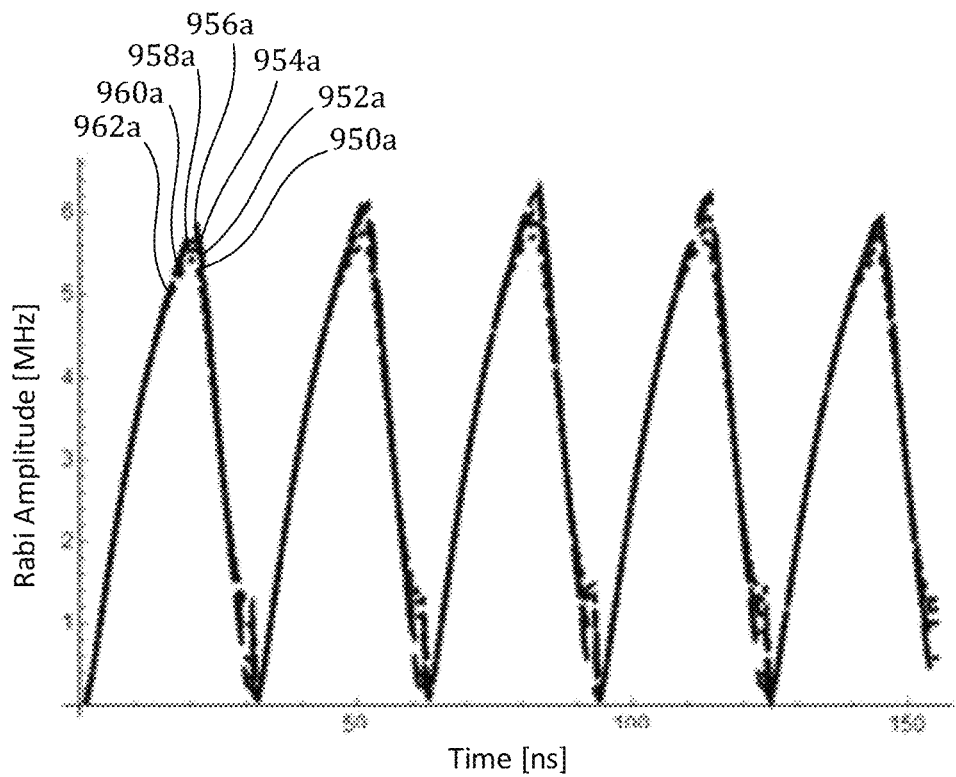
FIG. 9C is a graph of MICR Rabi drive amplitudes, at various $\alpha_L$ values, for a simulated transient response modeled using an example model, according to an example.
Figure 9D:
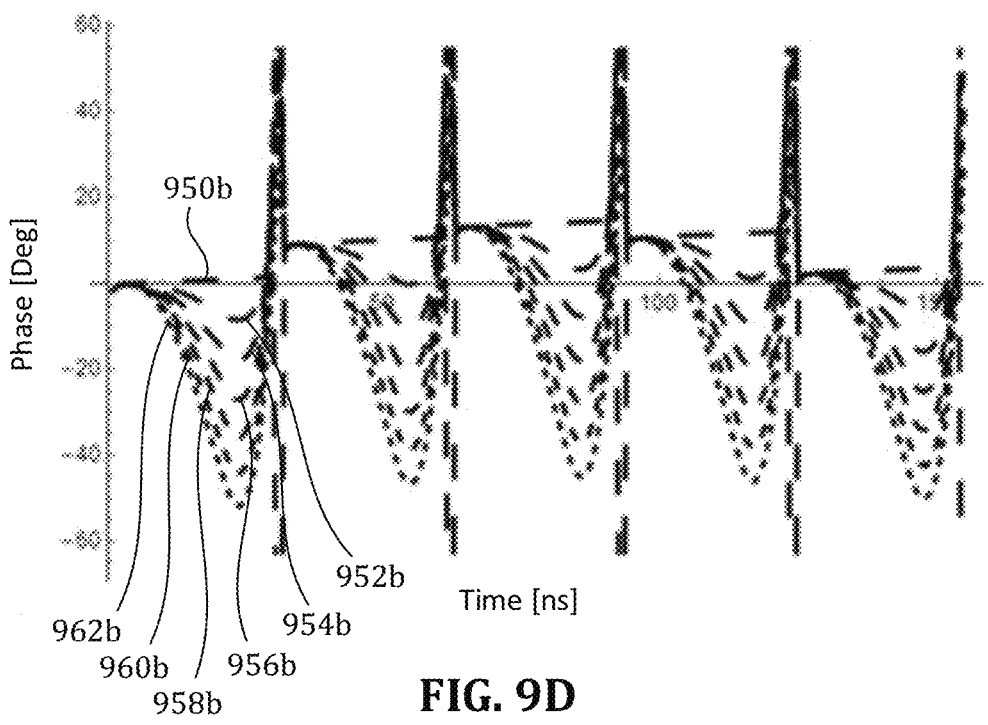
FIG. 9D is a graph of respective phases of the MICR Rabi drive amplitudes of FIG. 9C, according to an example.

Similarly, FIGS. 9C-9D present graphs of MICR Rabi drive amplitudes 950a, 952a, 954a, 956a, 958a, 960a, 962a and corresponding phases 950b, 952b, 954b, 956b, 958b, 960b, 962b, at various $\alpha_L$ values, for a simulated transient response, according to an example. The transient response is simulated using the same example model of FIGS. 9A-9B. The model parameters are the same as used for FIGS. 9A and 9B: $\alpha_L$=0, 0.005, 0.01, 0.015, 0.02, 0.025, and 0.03 as shown by respective data curves 950a, 952a, 954a, 956a, 958a, 960a, 962a and respective data curves 950b, 952b, 954b, 956b, 958b, 960b, 962b.

Figure 9E:
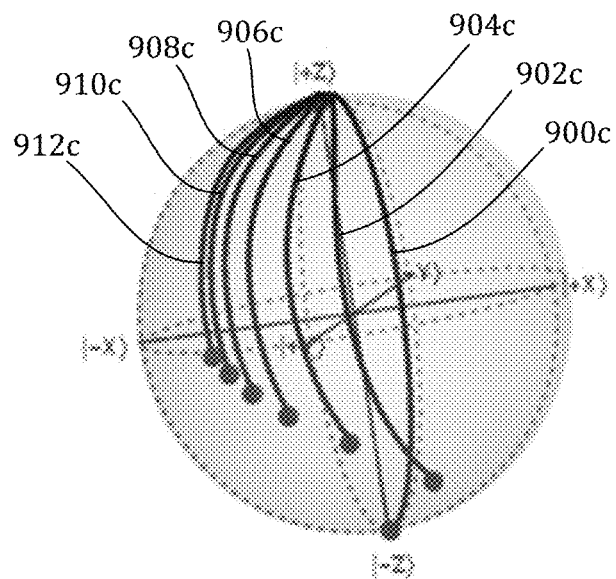
FIG. 9E is a spherical graph of Bloch sphere trajectories of a spin responding to the square pulses of FIGS. 9A and 9B, according to an example.
Figure 9F:
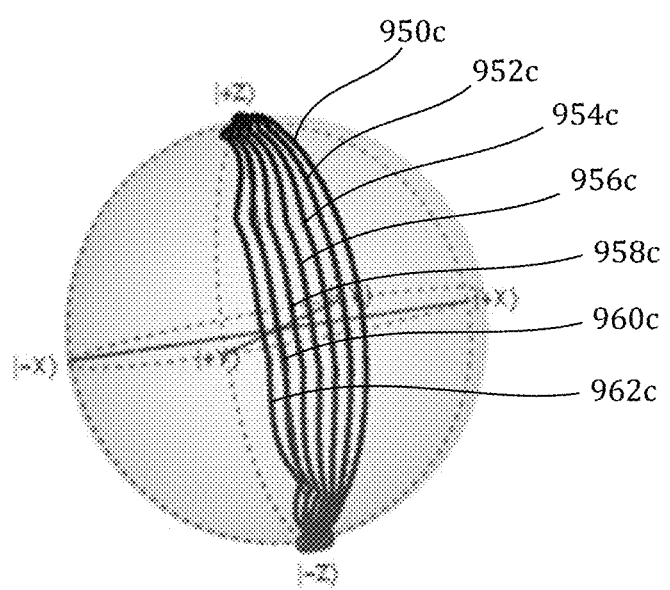
FIG. 9F is a spherical graph of Bloch sphere trajectories of a spin responding to the MICR pulses of FIGS. 9C and 9D, according to an example.

FIGS. 9E and 9F show, respectively, the effects of the square pulses of FIGS. 9A and 9B and the MICR pulses of FIGS. 9C and 9D on a Bloch sphere trajectory of a spin for a π-rotation from a +Z pole to a −Z pole. FIG. 9E presents a spherical graph of Bloch sphere trajectories 900c, 902c, 904c, 906c, 908c, 910c, 912c of a spin responding to the square pulses of FIGS. 9A and 9B, according to an example. The Bloch sphere trajectories 900c, 902c, 904c, 906c, 908c, 910c, 912c correspond to the square Rabi drive amplitudes 900a, 902a, 904a, 906a, 908a, 910a, 912a of FIG. 9A and the phases 900b, 902b, 904b, 906b, 908b, 910b, 912b of FIG. 9B. Similarly, FIG. 9F presents a spherical graph of Bloch sphere trajectories 950c, 952c, 954c, 956c, 958c, 960c, 962c of a spin responding to the MICR pulses of FIGS. 9C and 9D, according to an example. The Bloch sphere trajectories 950c, 952c, 954c, 956c, 958c, 960c, 962c correspond to the MICR Rabi drive amplitudes 950a, 952a, 954a, 956a, 958a, 960a, 962a of FIG. 9C and the phases 950b, 952b, 954b, 956b, 958b, 960b, 962b of FIG. 9D.

In comparing the Bloch sphere trajectories resulting from the square pulses and the MICR pulses, the MICR pulses are significantly more robust to variations in resonator nonlinearity. In FIGS. 9E and 9F, the Bloch sphere trajectories resulting from the square pulses are bowed away from a direct surface path between the +Z pole and the −Z pole. The Block sphere trajectories are also more spread out across a surface of the Bloch sphere. In contrast, the Bloch sphere trajectories resulting from the MICR pulses are tightly-packed and more closely follow the direct surface path between the +Z pole and the −Z pole.

Sequences of MICR pulses may be configured by determining one or more parameters for a model of a resonator. These model parameters may subsequently be used by a control system, such as the control system 200 of FIG. 2, to generate a sequence of parameters that represent a target operation (e.g., a π-rotation) to be performed on a spin system. In generating the sequence of parameters, the control system may utilize a computing system (e.g., the computing system 212 of FIG. 2). The sequence of parameters also defines a control sequence for the resonator that includes successive pairs of first and second pulses, each pair corresponding to a MICR pulse.

To determine the model parameters, multiple characterization processes may be completed, including: [1] measurement of a small-signal resonance frequency, a coupling factor, and a quality factor (Q) defining a linear behavior of the resonator, [2] measurement of a power-dependent behavior of the resonator to define one or more nonlinear parameters, and [3] measurement of a Rabi nutation frequency to define a current-field conversion ratio of the resonator. Any combination of these characterization processes may be completed, and in any order. Moreover, characterization of the linear kernel and the power-dependent response of the resonator may be performed in either the frequency domain or the time domain. Characterization of the Rabi nutation frequency may be either calculated through finite element simulations of a magnetic field generated by the resonator or inferred by Rabi nutation experiments performed on the spin system.

Frequency domain characterization may be conveniently performed using a vector network analyzer (VNA). For this measurement, a continuous-wave frequency-swept signal is applied to the resonator and either a reflected signal ($S_{11}$) or transmitted signal ($S_{21}$) is observed. The transmitted signal may be observed (or measured) as a function of applied power. As shown by FIG. 4, a small-signal response may be determined from a regime where minimal power dependence is observed, and the linear kernel of the resonator may be accurately modeled by a Lorentzian function. As power is increased, a resonance frequency of the transmitted signal, $S_{21}$, shifts downward in frequency. Moreover, the quality factor, Q and coupling change, and a frequency distribution of the transmitted signal becomes increasingly skewed. FIG. 5 shows the corresponding power-dependent response measured in the time domain by observing transmission through the resonator of a pulsed input signal with varying amplitude applied at the small-signal resonance frequency.

The values of the small-signal resonance frequency, coupling (or the coupling factor), and Q allow a fitting of geometric circuit parameters for an example model (or electric circuit model). A nonlinear inductance parameter may be fitted by using standard harmonic balance techniques for the characterization of nonlinear circuits. This characterization process provides a rough estimate of a complete model describing the transient response of the resonator. To determine the aforementioned parameters, a resonator may be excited by varying amplitude signals at small magnitudes to determine a quality factor, a resonance frequency, a nonlinear parameter defining a power-dependent resonator response, or some combination thereof. The small-signal resonance frequency of the resonator determines the carrier frequency of all applied voltage signals.

A characterization process may also be used to determine a first period of a first pulse of the MICR pulse. In some cases, the first period corresponds to an amount of time a constant amplitude and a phase input signal is applied to a resonator before a ringdown suppression is applied (or a second period of a second pulse single starts). Longer first periods correspond to higher effective Rabi drive strengths (faster quantum gates) but longer first periods may suffer from decreased robustness to model parameter variation as compared to shorter first periods. In many implementations, the first periods of a MICR pulse are kept constant regardless of the applied input power. In some instances, the first period may vary in temporal length between successive MICR pulses.

After the first period of the first pulse is determined for a given input power, a linear kernel may be defined to approximate a transient response over the first period. The linear kernel may function as a model of the resonator. A transient response of the nonlinear resonator subject to a large-amplitude drive over the first period may be approximated by the linear kernel for optimization efficiency. In some implementations, a nonlinear model may be used. The linear approximation of the non-linear model may improve an optimization and analysis efficiency of the MICR pulse without significantly affecting a performance of the MICR pulse. FIG. 8 shows an example of a nonlinear time-domain response with a defined first period and corresponding ringdown suppression (or second period).

Ringdown suppression may be performed as a subroutine that varies a time, an amplitude, and a phase of a second pulse to minimize a residual magnetic field at an end of the second period. Ringdown suppression is often more robust if the second period is a plurality of second periods. In some cases, a second period of the second pulse is determined as a subroutine that determines the first pulse. Whenever an amplitude, a phase, or both, of the first pulse are changed, an amplitude, a phase, or both, of the second pulse can be changed to drive the magnetic field to zero in magnitude at an end of the second period. The appropriate change may be determined by a numerical optimization procedure with the magnetic field amplitude at the end of the second pulse period as a performance functional (or metric). The appropriate change may also be calculated using an appropriate model.

In some implementations, a characterization process for determining MICR pulses includes determining a current-field conversion factor. The geometric current-field conversion ratio of the ratio may be determined either by a priori calculation, simulation, or measurement. In some instances, this factor may be measured using a detection experiment based on free-induction decay (FID) or an echo-detected Rabi nutation experiment. In a detection experiment based on free-induction decay, a certain number, n, of first periods of length $t_p$ of a first pulse are applied and the resulting free-induction decay is detected. Plotting the FID signal, S, as a function of n yields the Rabi frequency, $\omega_r$, as represented by Equation (5):

$$S(n, t_p) = A\sin(\omega_r\, n\, t_p)e^{-\frac{t_p}{\tau}} \quad (5)$$

Figure 10A:
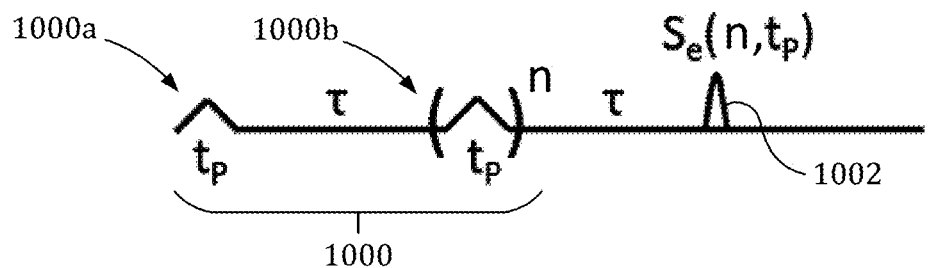
FIG. 10A is a schematic diagram of a MICR pulse sequence sent to a resonator and a spin echo pulse from a spin system coupled to the resonator that is generated in response, according to an example.
Figure 10B:
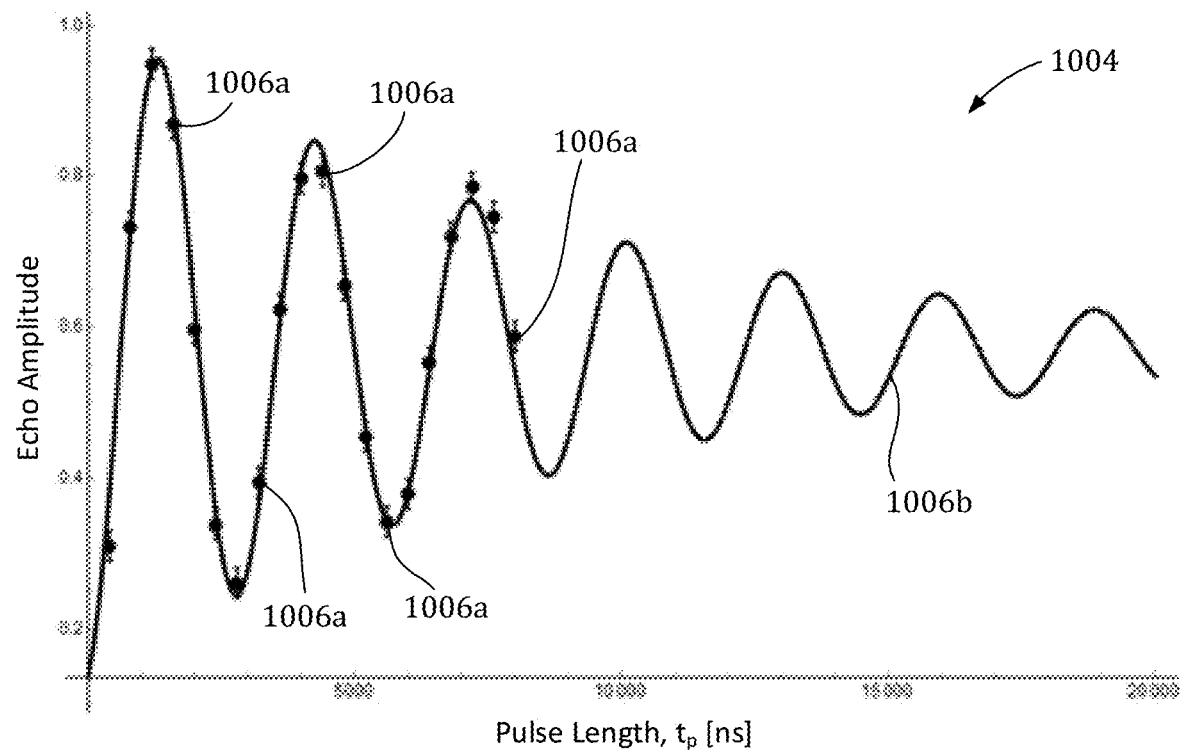
FIG. 10B is a graph of example oscillations of a simulated echo-detected Rabi measurement.

The time constant, $\tau$, in Equation (5) is different than the time constant, $\tau$, in Equations (1) and (2). In some instances, an echo pulse may be detected as a function of n, where a number of excitation or refocusing first pulses may be independently varied. FIGS. 10A-10B show an example of an echo-detected Rabi nutation measurement where a number of exciting first pulses of a MICR pulse sequence is held constant while a number of refocusing first pulses of the MICR pulse sequence is varied. The echo pulse as a function of the number of refocusing pulse periods, n, is the same as for FID detection.

FIG. 10A presents a schematic diagram of a MICR pulse sequence 1000 sent to a resonator and a spin echo pulse 1002 from a spin system coupled to the resonator that is generated in response, according to an example. The MICR pulse sequence 1000 includes a single exciting first pulse 1000a and a plurality of refocusing first pulses 1000b. The exciting first pulse 1000a has a first period of length, $t_p$, and a spin response of the spin system decoheres during a subsequent delay of length, $\tau$. The plurality of refocusing first pulses 1000b is applied with a varying number, n, of first periods. After a second delay of length $\tau$, the spin echo pulse 1002 (or $S_e$) appears and has an amplitude that depends on n and $t_p$.

FIG. 10B presents a graph of example oscillations 1004 of a simulated echo-detected Rabi measurement. The abscissa represents an increasing magnitude of echo amplitude and the ordinate represents increasing time in nanoseconds. Discrete points 1006a correspond to simulated data and the solid line corresponds to a curve 1006b fitted to the simulated data. In particular, the curve 1006b is fit to the simulated data 1006a using a decaying sinusoid model, namely, A $\sin(\omega t_p)e^{-t_p/\tau_2}$+B with a Rabi frequency of $\omega/2\pi$. Parameters of the fitted curve 1006b correspond to A=0.448, B=0.571, $\tau_2$=8775 ns, and $\omega/2\pi$=342 kHz.

In some implementations, after determining the model for the resonator and establishing the first and second periods for the MICR pulses, the MICR pulses and corresponding control sequences are determined using techniques for optimizing control sequences in the presence of transient response models. Examples of such techniques are described in U.S. Patent Publication No. 2017/0214410.

MICR pulses and their sequences provide an enhanced robustness to parameter variations in models of the resonator. FIGS. 9A-9F and 11A-11E compare the simulated transient responses of non-MICR pulses and MICR pulses for two cases: sequences of simple square pulses that perform a $\pi$ rotation in a homogeneous quantizing static magnetic field (see FIGS. 9A-9F), and sequences of optimized pulses that perform the same $\pi$ rotation over a range of resonance offsets corresponding to an inhomogeneous static magnetic field (see FIGS. 11A-11E). In both cases the sequences of MICR pulses are shown to be significantly more robust to variations in the non-linear parameter, $\alpha_L$, than sequences optimized using only a transient response model without a MICR scheme.

Figure 11A:
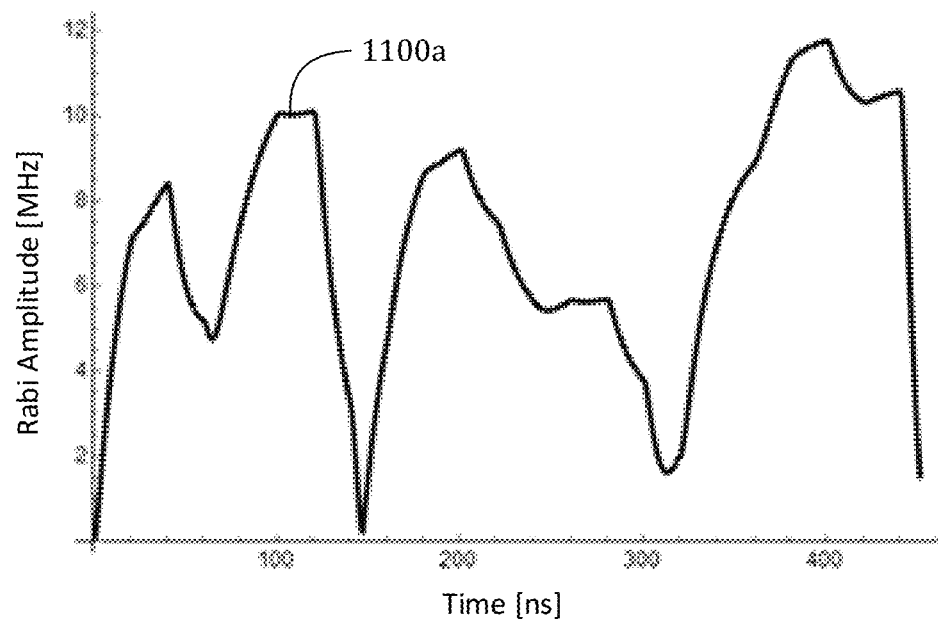
FIG. 11A is a graph of a Rabi drive amplitude for a simulated transient response of an optimized sequence of non-MICR pulses, according to an example.
Figure 11B:
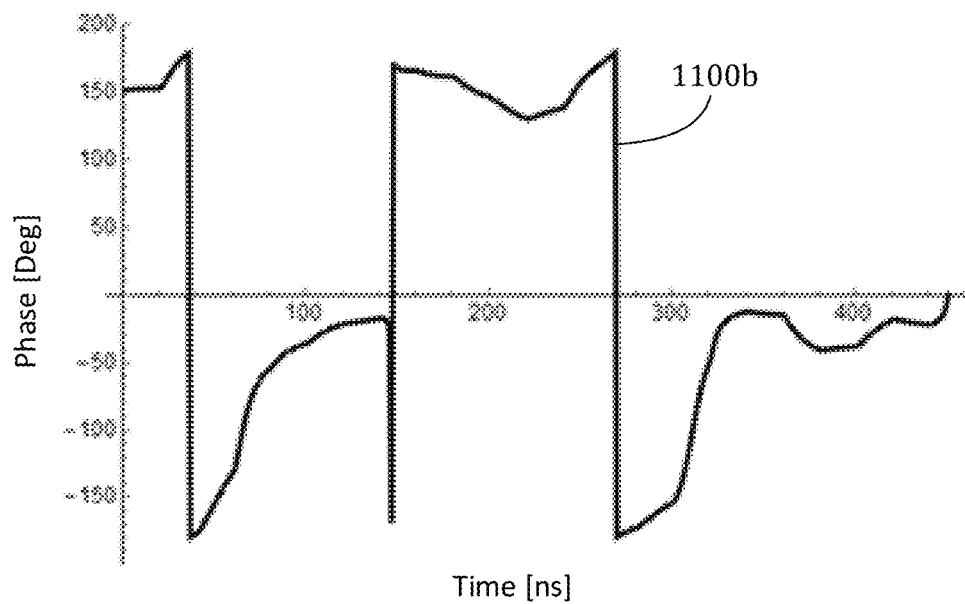
FIG. 11B is a graph of respective phases of the Rabi drive amplitudes of FIG. 11B, according to an example.
Figure 11C:
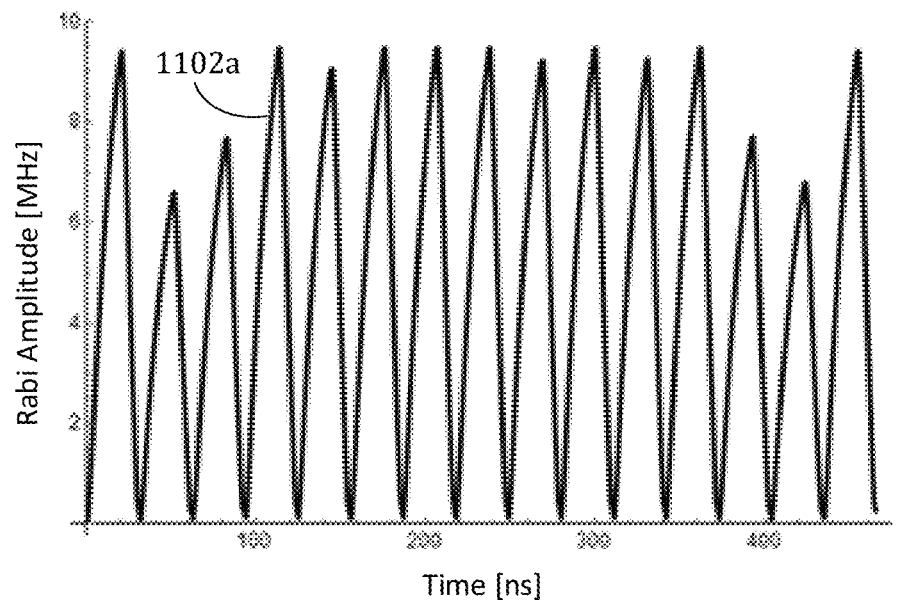
FIG. 11C is a graph of a Rabi drive amplitude for a simulated transient response of an optimized sequence of MICR pulses, according to an example.
Figure 11D:
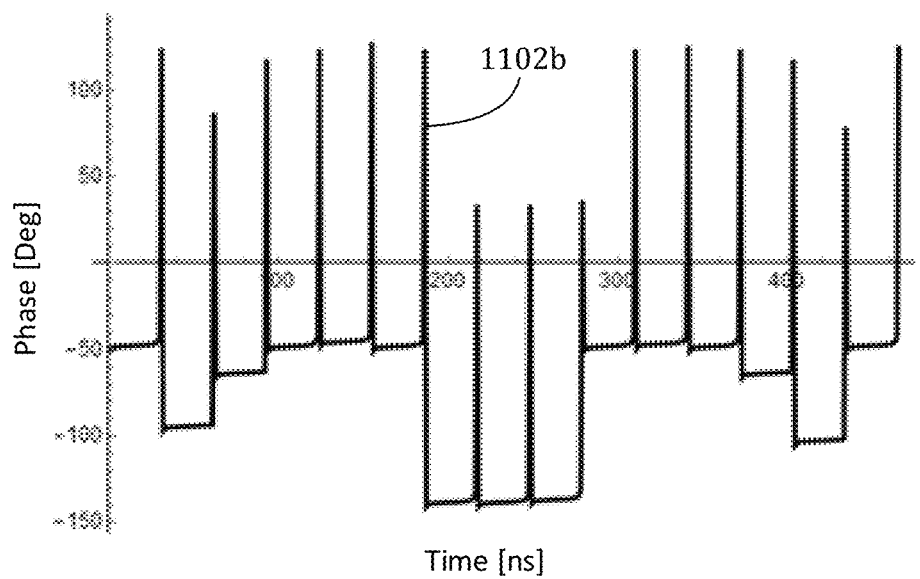
FIG. 11D is a graph of respective phases of the Rabi drive amplitudes of FIG. 11C, according to an example.

FIGS. 11A-11B present graphs of a Rabi drive amplitude 1100a and corresponding phase 1100b for a simulated transient response of an optimized sequence of non-MICR pulses, according to an example. The optimized sequence of non-MICR pulses is presented as a function of time, which is given in units of nanoseconds. FIGS. 11C-11D present graphs of a Rabi drive amplitude 1102a and corresponding phase 1102b for a simulated transient response of an optimized sequence of MICR pulses, according to an example. The optimized sequence of MICR pulses is presented as a function of time, which is also given in units of nanoseconds. Both pulse types were optimized to perform a $\pi$ rotation over a uniform distribution of resonance offsets (±3 MHz) with a 10 MHz Rabi drive strength.

Figure 11E:
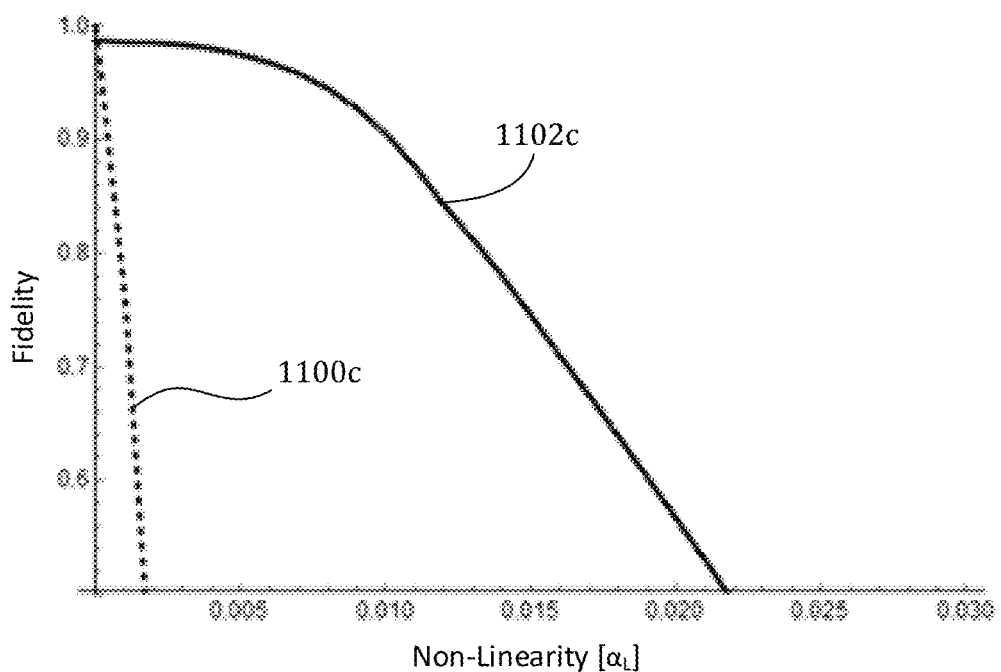
FIG. 11E is a graph of a fidelity of the optimized sequence of non-MICR pulses and the optimized sequence of MICR pulses, as a function of $\alpha_L$, of respective FIGS. 11A-11B and FIGS. 11C-11D, according to an example.

A fidelity of each pulse type is calculated over the uniform distribution of resonance offsets versus a strength of the nonlinearity, $\alpha_L$, as shown in FIG. 11E. In particular, FIG. 11E presents a graph of a fidelity of the optimized sequence of non-MICR pulses 1100c and the optimized sequence of MICR pulses 1102c, as a function of $\alpha_L$, of respective FIGS. 11A-11B and 11C-11D, according to an example. Relative to the fidelity of the optimized sequence of non-MICR pulses 1100c, the fidelity of the optimized sequence of MICR pulses 1102c decreases more slowly with increasing resonator non-linearity ($\alpha_L$). FIG. 11E thus demonstrates a significant increase in robustness of MICR pulses over non-MICR pulses.

Although the MICR pulses and their optimization have been described in the context of spin systems, the MICR pulses and their optimization are applicable to any quantum control scheme where sensitivity to model parameters increases with control time (or pulse length). Such model parameters may be derived from spin systems that include ensembles of electron spin, ensembles of nuclear spin, or both. In some instances, the model parameters may also be derived from quantum systems that include ensembles of trapped ions, photonic ensembles, and superconducting systems. Other quantum systems are possible.

In some implementations, a method for controlling a spin system in an external magnetic field includes sending a first pulse to a resonator over a first period. The resonator generates a magnetic field in response to receiving the first pulse. Moreover, the resonator applies the magnetic field to the spin system and the first pulse maintains the magnetic field in a transient state during the first period. The transient state may precede a steady state of the magnetic field, as shown in FIGS. 6A-7B. The method also includes sending a second pulse to the resonator over a second period immediately following the first period. The resonator alters a magnitude of the magnetic field to zero in response to receiving the second pulse. In combination, the first pulse and the second pulse may define a MICR pulse for the resonator. In some instances, the magnetic field includes an electric current, and the resonator may inductively-couple to the spin system.

In some implementations, the method additionally includes sending successive pairs of first and second pulses to the resonator. The successive pairs of first and second pulses define a control sequence that represents a target operation to be performed on the spin system, and the resonator generates the magnetic field in response to receiving the successive pairs of first and second pulses. In some implementations, the first period of the first pulse and the second period of the second pulse have a constant magnitude for each successive pair of first and second pulses.

In some implementations, the second pulse includes a plurality of pulses, each pulse of the plurality of pulses having a respective period. The respective periods of each pulse of the plurality of pulses, when summed, equal the second period of the second pulse.

In some implementations, the first pulse includes a first amplitude and a first phase and sending the first pulse includes applying the first amplitude, the first phase, or both, to the resonator. The first amplitude may include a voltage amplitude, a current amplitude, or both. Moreover, in some instances, the first amplitude and the first phase are constant over the first period. In some instances, the magnetic field is zero in magnitude at a beginning of the first period.

In some implementations, the second pulse includes a second amplitude and a second phase and sending the second pulse includes applying the second amplitude, the second phase, or both, to the resonator. The second amplitude may include a voltage amplitude, a current amplitude, or both. Moreover, in some instances, the second amplitude and the second phase are constant over the first period. In some instances, the magnetic field is zero in magnitude at an end of the second period.

In some implementations, a method for controlling a spin system in an external magnetic field includes selecting a target operation to be performed on the spin system, e.g., a π-rotation from a +Z pole to a −Z pole such as describe above in relation to FIGS. 9A-9F and FIGS. 11A-11E. The method also includes generating, by operation of a computing system, a sequence of parameters that represent the selected target operation and define a control sequence for a resonator. The control sequence includes successive pairs of first and second pulses. Each pair of first and second pulses may define a MICR pulse, and the pairs in succession may define a concatenated sequence of MICR pulses. The method additionally includes sending the successive pairs of first and second pulses to the resonator by alternately sending a first pulse to the resonator over a first period and sending a second pulse to the resonator over a second period immediately following the first period. In combination, the first pulse and the second pulse may define a MICR pulse for the resonator. The first pulse maintains the magnetic field in a transient state during the first period.

The method also includes generating a magnetic field from the resonator in response to receiving the successive pairs of first and second pulses. The magnetic field is applied by the resonator to the spin system. The method includes altering a magnitude of the generated magnetic field to zero in response to each received second pulse. The magnitude of the generated magnetic field is altered by the resonator.

In some implementations, the second pulse comprises a plurality of pulses, each pulse of the plurality of pulses having a respective period. The respective periods of each pulse of the plurality of pulses, when summed, equal the second period of the second pulse.

In some implementations, the first period of the first pulse and the second period of the second pulse have a constant magnitude for each successive pair of first and second pulses. In some implementations, the sequence of parameters a first amplitude and a first phase for each first pulse and a second amplitude and a second phase for each second pulse. The first amplitude and the first phase may be constant over the first period, and the second amplitude and the second phase may be constant over the second period. The first amplitude, the second amplitude, or both, may include a voltage amplitude, a current amplitude, or a combination thereof. In some instances, the magnetic field is zero in magnitude at a beginning of the first period. In some instances, the magnetic field is zero in magnitude at an end of the second period.

In some implementations, the method includes determining one or more parameters for a model of the resonator and calculating a temporal length of the transient state using the determined parameter and the model of the resonator. The step of sending a first pulse includes sending the first pulse to the resonator such that the first period of the first pulse occurs within the calculated temporal length of the transient state.

In some variations, determining one or more parameters for the model of the resonator includes measuring a characteristic of the resonator at different voltage amplitudes by iteratively applying a voltage pulse at a voltage amplitude to the resonator, measuring the characteristic of the resonator while the voltage pulse excites resonator, and altering the voltage amplitude of the voltage pulse. The measured characteristic includes a resonance frequency, a coupling factor, or a quality factor. In these variations, determining the one or more parameters for the model of the resonator also includes calculating the one or more parameters for the model of the resonator by fitting measurements of the characteristic to the model of the resonator. In some instances, the model of resonator may be an electrical circuit comprising an inductor, a capacitor, or a resistor, and the calculated parameter may include an inductance, a capacitance, or a resistance. In some instances, the model of resonator may be an electrical circuit comprising an inductor, a capacitor, or a resistor, and the calculated parameter comprises a term characterizing a non-linear behavior of the electrical circuit, e.g., $\alpha_L$ as described in relation to Equations (3) and (4).

In some variations, determining one or more parameters for the model of the resonator includes measuring a characteristic of the resonator at different power levels by iteratively applying a pulse amplitude to the resonator, measuring the characteristic of the resonator while the pulse amplitude excites resonator, and altering a magnitude of the pulse amplitude. In these variations, determining the one or more parameters for the model of the resonator includes calculating the one or more parameters for the model of the resonator by fitting measurements of the characteristic to the model of the resonator.

In some variations, determining one or more parameters for the model of the resonator includes measuring a current-field conversion factor of the resonator.

In some implementations, a system for controlling a spin system in an external magnetic field includes a resonator configured to generate a magnetic field in response to receiving pulses from a control system. The magnetic field is applied to the spin system. The system also includes the control system, which is coupled to the resonator. The control system is configured to perform operations that include defining a target operation to be performed on the spin system and generating a sequence of parameters that represent the target operation and establish a control sequence for the resonator. The operations performed by the control system also include converting the control sequence into successive pairs of first and second pulses and sending the successive pairs of first and second pulses to the resonator by alternately sending a first pulse to the resonator over a first period and sending a second pulse to the resonator over a second period immediately following the first period. Each pair of first and second pulses may define a MICR pulse, and the pairs in succession may define a concatenated sequence of MICR pulses. Each first pulse maintains the magnetic field generated by the resonator in a transient state during the first period, and the resonator alters a magnitude of the generated magnetic field to zero in response to each received second pulse.

In some implementations, the system includes the spin system, coupled to the resonator and having one or more spins that respond to the generated magnetic field of the resonator. In some implementations, the resonator includes s a superconducting resonator device. In some implementations, the control system includes a waveform generator and an amplifier. In further implementations, the control system may optionally include a receiver.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. Elements of a computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Moreover, a computer can be embedded in another device, e.g., a phone, an electronic appliance, a mobile audio or video player, a game console, a Global Positioning System (GPS) receiver, or a portable storage device (e.g., a universal serial bus (USB) flash drive). Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. In some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Implementations of the methods and systems for controlling a spin system in an external magnetic field may also be described by the following examples:

Example 1

A method for controlling a spin system in an external magnetic field, the method comprising:
  selecting a target operation to be performed on the spin system;
  generating, by operation of a computing system, a sequence of parameters that represent the selected target operation and define a control sequence for a resonator, the control sequence comprising successive pairs of first and second pulses;
  sending the successive pairs of first and second pulses to the resonator by alternately:
    sending a first pulse to the resonator over a first period, and
    sending a second pulse to the resonator over a second period immediately following the first period;
  generating a magnetic field from the resonator in response to receiving the successive pairs of first and second pulses, the magnetic field applied by the resonator to the spin system;
  altering a magnitude of the generated magnetic field to zero in response to each received second pulse, the magnitude of the generated magnetic field altered by the resonator; and
  wherein the first pulse maintains the magnetic field in a transient state during the first period.

Example 2

The method of example 1,
  wherein the second pulse comprises a plurality of pulses, each pulse of the plurality of pulses having a respective period; and
  wherein the respective periods of each pulse of the plurality of pulses, when summed, equal the second period of the second pulse.

Example 3

The method of example 1 or 2, wherein the first period of the first pulse and the second period of the second pulse have a constant magnitude for each successive pair of first and second pulses.

Example 4

The method of example 1 or any one of examples 2-3, wherein the sequence of parameters comprises:
  a first amplitude and a first phase for each first pulse, and
  a second amplitude and a second phase for each second pulse.

Example 5

The method of example 4, wherein the first amplitude and the first phase are constant over the first period.

Example 6

The method of example 4 or 5, wherein the second amplitude and the second phase are constant over the second period.

Example 7

The method of example 4 or any one of examples 5-6, wherein the first amplitude and the second amplitude comprise voltage amplitudes.

Example 8

The method of example 4 or any one of examples 5-7, wherein the first amplitude and the second amplitude comprise current amplitudes.

Example 9

The method of example 4 or any one of examples 5-8, wherein the magnetic field is zero in magnitude at a beginning of the first period.

Example 10

The method of example 4 or any one of examples 5-9, wherein the magnetic field is zero in magnitude at an end of the second period.

Example 11

The method of example 1 or any one of examples 5-10, comprising:
  determining one or more parameters for a model of the resonator;
  calculating a temporal length of the transient state using the determined parameter and the model of the resonator; and
  wherein sending a first pulse comprises sending the first pulse to the resonator such that the first period of the first pulse occurs within the calculated temporal length of the transient state.

Example 12

The method of example 11, wherein determining one or more parameters for the model of the resonator comprises:
  measuring a characteristic of the resonator at different voltage amplitudes by iteratively:
    applying a voltage pulse at a voltage amplitude to the resonator,
    measuring the characteristic of the resonator while the voltage pulse excites resonator,
    altering the voltage amplitude of the voltage pulse, and
    wherein the measured characteristic comprises a resonance frequency, a coupling factor, or a quality factor; and
  calculating the one or more parameters for the model of the resonator by fitting measurements of the characteristic to the model of the resonator.

Example 13

The method of example 12,
  wherein the model of resonator is an electrical circuit comprising an inductor, a capacitor, or a resistor; and
  wherein the calculated parameter comprises an inductance, a capacitance, or a resistance.

Example 14

The method of example 12 or 13,
wherein the model of resonator is an electrical circuit comprising an inductor, a capacitor, or a resistor; and
wherein the calculated parameter comprises a term characterizing a non-linear behavior of the electrical circuit.

Example 15

The method of example 11 or any one of examples 12-14, wherein determining one or more parameters for the model of the resonator comprises:
measuring a characteristic of the resonator at different power levels by iteratively:
applying a pulse amplitude to the resonator,
measuring the characteristic of the resonator while the pulse amplitude excites resonator, and
altering a magnitude of the pulse amplitude; and
calculating the one or more parameters for the model of the resonator by fitting measurements of the characteristic to the model of the resonator.

Example 16

The method of example 11 or any one of examples 12-15, wherein determining one or more parameters for the model of the resonator comprises:
measuring a current-field conversion factor of the resonator.

Example 17

A system for controlling a spin system in an external magnetic field, comprising:
a resonator configured to generate a magnetic field in response to receiving pulses from a control system, the magnetic field applied to the spin system; and
the control system, coupled to the resonator and configured to perform operations comprising:
defining a target operation to be performed on the spin system,
generating a sequence of parameters that represent the target operation and establish a control sequence for the resonator,
converting the control sequence into successive pairs of first and second pulses,
sending the successive pairs of first and second pulses to the resonator by alternately,
sending a first pulse to the resonator over a first period,
sending a second pulse to the resonator over a second period immediately following the first period,
wherein each first pulse maintains the magnetic field generated by the resonator in a transient state during the first period, and
wherein the resonator alters a magnitude of the generated magnetic field to zero in response to each received second pulse.

Example 18

The system of example 17, comprising:
the spin system, coupled to the resonator and having one or more spins that respond to the magnetic field generated by the resonator.

Example 19

The system of example 17 or 18, wherein the resonator comprises a superconducting resonator device.

Example 20

The system of example 17 or any one of examples 18-19, wherein control system comprises a waveform generator and an amplifier.

Example 21

A method for controlling a spin system in an external magnetic field, the method comprising:
sending a first pulse to a resonator over a first period, the resonator generating a magnetic field in response to receiving the first pulse, the magnetic field applied by the resonator to the spin system;
sending a second pulse to the resonator over a second period immediately following the first period, the resonator altering a magnitude of the magnetic field to zero in response to receiving the second pulse; and
wherein the first pulse maintains the magnetic field in a transient state during the first period.

Example 22

The method of example 21, comprising.
sending successive pairs of first and second pulses to the resonator;
wherein the successive pairs of first and second pulses define a control sequence that represents a target operation to be performed on the spin system; and
wherein the resonator generates the magnetic field in response to receiving the successive pairs of first and second pulses.

Example 23

The method of example 22, wherein the first period of the first pulse and the second period of the second pulse have a constant magnitude for each successive pair of first and second pulses.

Example 24

The method of example 21 or any one of examples 22-23,
wherein the second pulse comprises a plurality of pulses, each pulse of the plurality of pulses having a respective period; and
wherein the respective periods of each pulse of the plurality of pulses, when summed, equal the second period of the second pulse.

Example 25

The method of example 21 or any one of examples 22-24,
wherein the first pulse comprises a first amplitude and a first phase; and
wherein sending the first pulse comprises applying the first amplitude, the first phase, or both, to the resonator.

Example 26

The method of example 25, wherein the first amplitude comprises a voltage amplitude.

Example 27

The method of example 25 or 26, wherein the first amplitude comprises a current amplitude.

Example 28

The method of example 25 or any one of examples 26-27, wherein the first amplitude and the first phase are constant over the first period.

Example 29

The method of example 25 or any one of examples 26-28, wherein the magnetic field is zero in magnitude at a beginning of the first period.

Example 30

The method of example 21 or any one of examples 22-29, wherein the second pulse comprises a second amplitude and a second phase; and
  wherein sending the second pulse comprises applying the second amplitude, the second phase, or both, to the resonator.

Example 31

The method of example 30, wherein the second amplitude comprises a voltage amplitude.

Example 32

The method of example 30 or 31, wherein the second amplitude comprises a current amplitude.

Example 33

The method of example 30 or any one of examples 31-32, wherein the second amplitude and the second phase are constant over the second period.

Example 34

The method of example 30 or any one of examples 31-33, wherein the magnetic field is zero in magnitude at an end of the second period.

Example 35

The method of example 21 or any one of examples 22-34, wherein the magnetic field comprises an electric current.

Example 36

The method of claim 35, wherein the resonator is inductively-coupled to the spin system.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method for controlling a spin system in an external magnetic field, the method comprising:
  selecting a target operation to be performed on the spin system;
  generating, by operation of a computing system, a sequence of parameters that represent the selected target operation and define a control sequence for a resonator, the control sequence comprising successive pairs of first and second pulses and corresponding to a shaped pulse that:
    suppresses hysteretic effects of the resonator by driving a magnetic field produced by the resonator to zero at the beginning and end of each successive pair of first and second pulses, and
    provides control that is insensitive to variations in parameters of the resonator by maintaining the magnetic field in a transient state;
  sending the successive pairs of first and second pulses to the resonator by alternately:
    sending a first pulse to the resonator over a first period, and
    sending a second pulse to the resonator over a second period immediately following the first period;
  generating a magnetic field from the resonator in response to receiving the successive pairs of first and second pulses, the magnetic field applied by the resonator to the spin system; and
  altering a magnitude of the generated magnetic field to zero in response to each second pulse, the magnitude of the generated magnetic field altered by the resonator;
  wherein the first pulse maintains the magnetic field in a transient state during the first period.

2. The method of claim 1,
  wherein the second pulse comprises a plurality of pulses, each pulse having a respective period; and
  wherein the respective periods of each pulse, when summed, equal the second period of the second pulse.

3. The method of claim 1, wherein the sequence of parameters comprises:
  a first amplitude and a first phase for each first pulse, and
  a second amplitude and a second phase for each second pulse.

4. The method of claim 3, wherein the first amplitude and the second amplitude comprise voltage amplitudes.

5. The method of claim 3, wherein the first amplitude and the second amplitude comprise current amplitudes.

6. The method of claim 3, wherein the first amplitude and the first phase are constant over the first period.

7. The method of claim 3, wherein the magnetic field is zero in magnitude at the beginning of the first period.

8. The method of claim 1, comprising:
determining one or more parameters for a model of the resonator; and
calculating a temporal length of the transient state using the model of the resonator and the one or more determined parameters;
wherein sending a first pulse comprises sending the first pulse to the resonator such that the first period of the first pulse occurs within the calculated temporal length of the transient state.

9. The method of claim 8, wherein determining one or more parameters for the model of the resonator comprises:
measuring a characteristic of the resonator at different voltage amplitudes by iteratively:
applying a voltage pulse at a voltage amplitude to the resonator,
measuring the characteristic of the resonator while the voltage pulse excites resonator, and
altering the voltage amplitude of the voltage pulse,
wherein the measured characteristic comprises a resonance frequency, a coupling factor, or a quality factor; and
calculating the one or more parameters for the model of the resonator by fitting measurements of the characteristic to the model of the resonator.

10. The method of claim 9,
wherein the model of resonator is an electrical circuit comprising an inductor, a capacitor, or a resistor; and
wherein the calculated parameter comprises an inductance, a capacitance, or a resistance.

11. The method of claim 8, wherein determining one or more parameters for the model of the resonator comprises:
measuring a characteristic of the resonator at different power levels by iteratively:
applying a pulse amplitude to the resonator,
measuring the characteristic of the resonator while the pulse amplitude excites resonator, and
altering a magnitude of the pulse amplitude; and
calculating the one or more parameters for the model of the resonator by fitting measurements of the characteristic to the model of the resonator.

12. The method of claim 8, wherein determining one or more parameters for the model of the resonator comprises:
measuring a current-field conversion factor of the resonator.

13. A system for controlling a spin system in an external magnetic field, comprising:
a resonator configured to generate a magnetic field in response to receiving pulses from a control system, the magnetic field applied to the spin system; and
the control system, coupled to the resonator and configured to perform operations comprising:
defining a target operation to be performed on the spin system,
generating a sequence of parameters that represent the target operation and establish a control sequence for the resonator,
converting the control sequence into successive pairs of first and second pulses,
sending the successive pairs of first and second pulses to the resonator by alternately,
sending a first pulse to the resonator over a first period,
sending a second pulse to the resonator over a second period immediately following the first period,
wherein each first pulse maintains the magnetic field generated by the resonator in a transient state during the first period,
wherein the resonator alters a magnitude of the generated magnetic field to zero in response to each received second pulse, and
wherein the control sequence corresponds to a shaped pulse that:
suppresses hysteretic effects of the resonator by driving a magnetic field produced by the resonator to zero at the beginning and end of each successive pair of first and second pulses, and
provides control that is insensitive to variations in parameters of the resonator by maintaining the magnetic field in a transient state.

14. The system of claim 13, comprising:
the spin system, coupled to the resonator and having one or more spins that respond to the magnetic field generated by the resonator.

15. The system of claim 13, wherein the resonator comprises a superconducting resonator device.

* * * * *